(12) United States Patent
Lee et al.

(10) Patent No.: US 10,847,208 B2
(45) Date of Patent: Nov. 24, 2020

(54) MEMORY DEVICE SYSTEM-ON-CHIP INCLUDING THE SAME AND METHOD OF OPERATING THE SAME

(71) Applicant: Samsung Electronics Co., Ltd., Suwon-si (KR)

(72) Inventors: In-Hak Lee, Daegu (KR); Sang-Yeop Baeck, Yongin-si (KR); Jae-Seung Choi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/127,621

(22) Filed: Sep. 11, 2018

(65) Prior Publication Data

US 2019/0164596 A1    May 30, 2019

(30) Foreign Application Priority Data

Nov. 29, 2017    (KR) .................. 10-2017-0161231

(51) Int. Cl.
| | |
|---|---|
| *G11C 11/417* | (2006.01) |
| *G11C 8/08* | (2006.01) |
| *G11C 5/14* | (2006.01) |
| *G11C 8/10* | (2006.01) |
| *G11C 11/419* | (2006.01) |
| *G11C 11/418* | (2006.01) |
| *G11C 29/02* | (2006.01) |

(52) U.S. Cl.
CPC .......... *G11C 11/417* (2013.01); *G11C 5/147* (2013.01); *G11C 8/08* (2013.01); *G11C 8/10* (2013.01); *G11C 11/418* (2013.01); *G11C 11/419* (2013.01); *G11C 29/021* (2013.01); *G11C 29/028* (2013.01)

(58) Field of Classification Search
CPC ... G11C 11/417; G11C 11/418; G11C 11/419; G11C 8/08; G11C 8/10; G11C 5/147
USPC ........................................................ 365/154
See application file for complete search history.

(56) References Cited

U.S. PATENT DOCUMENTS

| | | | |
|---|---|---|---|
| 8,228,713 B2* | 7/2012 | Arsovski ............... | G11C 11/413 365/154 |
| 8,284,626 B2 | 10/2012 | Prasad et al. | |
| 8,488,396 B2 | 7/2013 | Lee et al. | |

(Continued)

FOREIGN PATENT DOCUMENTS

KR    10-2014-0125614 A    10/2014

*Primary Examiner* — Alfredo Bermudez Lozada
(74) *Attorney, Agent, or Firm* — Harness, Dickey & Pierce, P.L.C.

(57) ABSTRACT

A memory device includes a memory cell array and a peripheral circuit. The memory cell array receives a first power supply voltage and includes a plurality of bit cells that store data based on the first power supply voltage. The peripheral circuit is receives a second power supply voltage and controls the memory cell array based on the second power supply voltage. The peripheral circuit includes a voltage generation circuit that receives the first power supply voltage and the second power supply voltage. The voltage generation circuit adaptively adjusts a word-line driving voltage directly or indirectly based on a difference between the first power supply voltage and the second power supply voltage during a memory operation on the plurality of bit cells, and applies the word-line driving voltage to a first word-line coupled to first bit cells selected from the bit cells.

20 Claims, 17 Drawing Sheets

(56) References Cited

U.S. PATENT DOCUMENTS

| | | | |
|---|---|---|---|
| 9,001,572 B2 | 4/2015 | Choi et al. | |
| 9,508,405 B2 | 11/2016 | Jain et al. | |
| 2010/0302880 A1* | 12/2010 | Wang | G11C 8/08 |
| | | | 365/189.11 |
| 2015/0302918 A1 | 10/2015 | Roy et al. | |
| 2015/0340073 A1* | 11/2015 | Seo | G11C 7/222 |
| | | | 365/189.09 |
| 2017/0243620 A1 | 8/2017 | Chang et al. | |
| 2017/0243635 A1 | 8/2017 | Sonkar | |
| 2017/0301396 A1* | 10/2017 | Dhori | G11C 11/419 |

\* cited by examiner

MEMORY DEVICE SYSTEM-ON-CHIP INCLUDING THE SAME AND METHOD OF OPERATING THE SAME

CROSS-REFERENCE TO RELATED APPLICATION

This U.S. non-provisional application claims the benefit of priority under 35 U.S.C. § 119 to Korean Patent Application No. 10-2017-0161231, filed on Nov. 29, 2017 in the Korean Intellectual Property Office (KIPO), the disclosure of which is incorporated by reference herein in its entirety.

BACKGROUND

Various example embodiments of the inventive concepts relate to a semiconductor device, and more particularly, to a memory device, a system-on-chip including the same, and/or a method of operating the memory device.

Generally, a static random access memory (SRAM) device stores data in a latch circuit of a memory cell through a bit line and a complementary bit line during a write operation, and reads data stored in the latch circuit of the memory cell by sensing a voltage difference between the bit line and the complementary bit line, which is determined based on the data stored in the latch circuit of the memory cell, during a read operation.

In the SRAM device, a write assist operation may be performed to enhance the write performance of the SRAM device.

SUMMARY

According to at least one example embodiment of the inventive concepts, a memory device includes a memory cell array and a peripheral circuit. The memory cell array receives a first power supply voltage and includes a plurality of bit cells that store data based on the first power supply voltage. The peripheral circuit receives a second power supply voltage and controls the memory cell array based on the second power supply voltage. The peripheral circuit includes a voltage generation circuit that receives the first power supply voltage and the second power supply voltage. The voltage generation circuit adaptively adjusts a word-line driving voltage directly or indirectly based on a difference between the first power supply voltage and the second power supply voltage during a memory operation on the plurality of bit cells, and applies the adjusted word-line driving voltage a first word-line coupled to first bit cells selected from the plurality of bit cells.

According to at least one example embodiment of the inventive concepts, a system-on-chip device includes a memory device, a processing circuit, and a power management integrated circuit (PMIC). The memory device includes a memory cell array configured to store data, the memory cell array including a plurality of bit cells, and a peripheral circuit to control the memory cell array. The processing circuit provides the data to the memory device before the data is stored in the memory cell array, and receives the data stored in the memory cell array from the memory device. The PMIC provides a first power supply voltage to the memory cell array and provides a second power supply voltage to the peripheral circuit. The peripheral circuit includes a voltage generation circuit that is supplied with the first power supply voltage and the second power supply voltage. The voltage generation circuit adaptively adjusts a word-line driving voltage directly or indirectly based on a difference between the first power supply voltage and the second power supply voltage during a memory operation on the plurality of bit cells, and applies the word-line driving voltage a first word-line coupled to first bit cells selected from the plurality of bit cells.

According to at least one example embodiment of the inventive concepts, in a method of operating a memory device that includes a memory cell array including a plurality of bit cells to store data, and a peripheral circuit to control the memory cell array, the method includes generating a result based on a first power supply voltage supplied to the memory cell array and a second power supply voltage supplied to the peripheral circuit, maintaining a level of a word-line driving voltage is when the results indicate that the first power supply voltage is smaller than or equal to the second power supply voltage applied to a first word-line coupled to first bit cells selected from the plurality of bit cells during a memory operation on the plurality of bit cells, and decreasing the level of the word-line driving voltage applied to the first word-line coupled to the first bit cells based on a difference between the first power supply voltage and the second power supply voltage during the memory operation on the plurality of bit cells, when the results indicate that the first power supply voltage is greater than the second power supply voltage.

Accordingly, in a memory device including a memory cell array and a peripheral circuit, a voltage generation circuit in the peripheral circuit adaptively adjusts a word-line driving voltage based on a difference between a first power supply voltage provided to the memory cell array and a second power supply voltage provided to the peripheral circuit during a memory operation. Therefore, the memory device may ensure operation stability while maintaining and/or enhancing operation performance during the memory operation.

BRIEF DESCRIPTION OF THE DRAWINGS

The above and other features of the inventive concepts will be more clearly understood by describing in detail example embodiments thereof with reference to the accompanying drawings.

DETAILED DESCRIPTION

Figure 1:
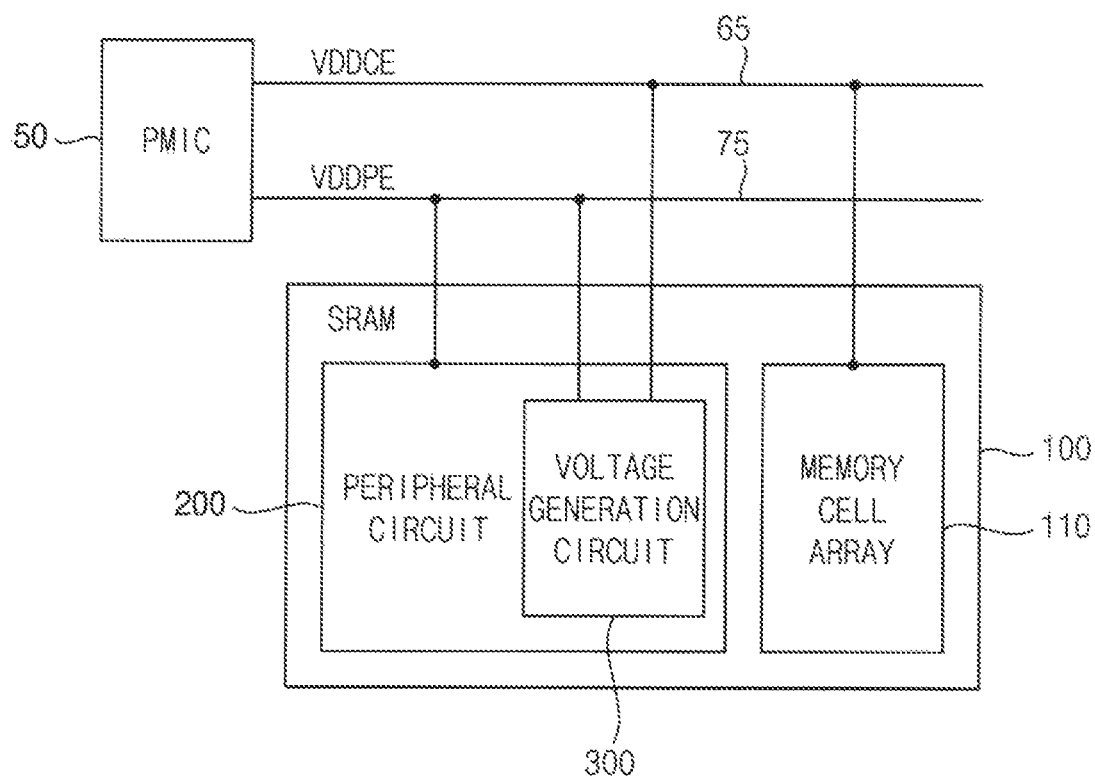
FIG. 1 is a block diagram illustrating a memory device according to at least one example embodiment.

Various example embodiments of the inventive concepts will be described more fully hereinafter with reference to the accompanying drawings. Like reference numerals may refer to like elements throughout this application.

Figure 2:
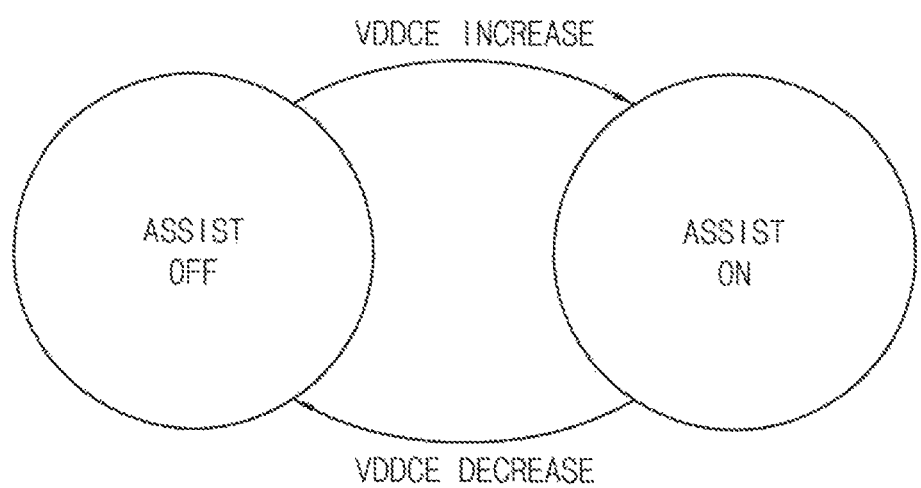
FIG. 2 is a diagram for describing an operation of a memory device according to at least one example embodiment.

FIG. 1 is a block diagram illustrating a memory device according to at least one example embodiment, and FIG. 2 is a diagram for describing an operation of a memory device according to at least one example embodiment.

Referring to FIG. 1, a memory device (or a static memory device) 100 includes a memory cell array 110 that stores data, and a peripheral circuit 200 that controls the memory cell array 110, but the example embodiments are not limited thereto.

The memory cell array 110 and the peripheral circuit 200 may be supplied with different power supply voltages VDDCE and VDDPE. For example, the memory cell array 110 may be supplied with a first power supply voltage VDDCE from a power management integrated circuit (PMIC) 50 through a first power supply line 65, and the peripheral circuit 200 may be supplied with a second power supply voltage VDDPE from the PMIC 50 through a second power supply line 75.

The memory cell array 110 may store, retain, and/or change the data based on the first power supply voltage VDDCE supplied to the memory cell array 110, and the peripheral circuit 200 may perform an operation of the memory device 100 (e.g., a write operation, a read operation, an erase operation, etc., for the memory cell array 110) based on the second power supply voltage VDDPE supplied to the peripheral circuit 200.

Due to a desire to reduce the power consumption of the memory device 100 and/or the power consumption of an electronic device including the memory device 100, a voltage level of a power supply voltage provided to the memory device 100 has been decreased. However, since a distribution of characteristics of memory cells has widened as the semiconductor manufacturing process has been continuously developed, operation stability (e.g., the operational stability and/or performance, etc.) of the memory cells may not be ensured at the decreased power supply voltage levels that are currently used.

In at least one example embodiment, while the power consumption may be reduced by supplying the peripheral circuit 200 with the relatively low power supply voltage VDDPE, the operation stability of the memory cell array 110 may be achieved by supplying the memory cell array 110 with the relatively high power supply voltage VDDCE. This technique that supplies the different power supply voltages VDDCE and VDDPE to the memory cell array 110 and the peripheral circuit 130 may be referred to as a "dual power rail" technique.

However, even in a memory device having the dual power rail structure, the operation stability of the memory device may not be ensured due to dynamic changes to the power supply voltages VDDCE and VDDPE. For example, in a case where a dynamic voltage and frequency scaling (DVFS) technique that dynamically changes the power supply voltage during operation is applied to a system-on-chip (SoC), processor, computing device, etc., including the memory device 100 (and/or other power-saving techniques), the PMIC 50 may determine to supply the memory cell array 110 and the peripheral circuit 200 with the power supply voltages VDDCE and VDDPE having the same voltage level.

However, in this case, since the first and second power supply lines 65 and 75 may have different resistances, and the memory cell array 110 and the peripheral circuit 200 may have different current consumptions, leakage currents, parasitic capacitances, etc., the power supply voltages VDDCE and VDDPE may drop (e.g., IR-drop) by different amounts. Accordingly, the power supply voltages VDDCE and VDDPE provided to the memory cell array 110 and/or the peripheral circuit 200 may have different voltage levels.

In particular, when the first power supply voltage VDDCE provided to the memory cell array 110 is lower than the second power supply voltage VDDPE provided to the peripheral circuit 200, an operation speed of the peripheral circuit 200 may be faster than that of the memory cell array 110, and thus a write margin and/or a read margin for the memory cell array 110 may not be sufficiently obtained. In other words, the peripheral circuit 200 may operate faster than the memory cell array 110 and the memory operation (e.g., read, write, etc.) may not complete in time and thereby cause errors. Accordingly, the operation stability (e.g., write stability, read stability, etc.) of the memory device 100 may not be ensured.

Particularly, when a voltage of a word-line coupled to a bit cell is higher than the second power supply voltage VDDPE supplied to a bit-line pair, the bit cell is half selected and the data stored in the bit cell may be flipped. Accordingly, a read disturbance may occur in a read operation of the memory device.

To obviate this problem, in the memory device 100 according to at least one example embodiment, the peripheral circuit 200 includes a voltage generation circuit 300. In at least one example embodiment, the voltage generation circuit 300 is supplied with the first power supply voltage VDDCE and the second power supply voltage VDDPE, and adaptively adjusts a word-line driving voltage directly or indirectly according to a difference between the first power supply voltage VDDCE and the second power supply voltage VDDPE during a memory operation on a plurality of bit cells in the memory cell array 110. The word-line driving voltage is applied to a first word-line coupled to first bit cells selected from the plurality of bit cells. Therefore, the operation stability (e.g., write stability, read stability, etc.) of the memory device 100 may be improved and/or ensured in comparison to conventional memory device circuits.

That is, the voltage generation circuit 300 may retain the word-line driving voltage at a regular level (e.g., a desired voltage level, a default voltage level, a threshold voltage level, etc.) during a non-assist interval in which the first power supply voltage VDDCE is smaller than or equal to the second power supply voltage VDDPE. During the non-assist interval, the level (e.g., voltage level) of the word-line driving voltage needs not to be lowered (and/or it is desired that the word-line driving voltage be maintained and/or increased). Therefore, the memory device 100 may increase and/or prevent reduction of the operating speed of the memory device 100 and/or peripheral circuit 200 that may occur due to lowered level of the word-line driving voltage, and consequently may enhance the write margin of the write operation.

In addition, the voltage generation circuit 300 may decrease a level of the word-line driving voltage in proportion to (and/or based on) a difference between the first power supply voltage VDDCE and the second power supply voltage VDDPE during an assist interval in which the level of the word-line driving voltage needs to be lowered (and/or during an interval when it is desired that the word-line driving voltage be lowered). Therefore, the memory device 100 may reduce and/or prevent the read disturbance and may improve and/or ensure the operation stability in the read operation.

In at least one example embodiment, the voltage generation circuit 300 may decrease a level of a word-line power voltage applied to a word-line driver voltage in proportion to (and/or based on) the difference between the first power supply voltage VDDCE and the second power supply voltage VDDPE. The word-line driver applies the word-line driving voltage to the first word-line. In at least one example embodiment, the voltage generation circuit 300 may decrease a level of the word-line driving voltage. That is, the memory device 100 may decrease the level of the word-line driving voltage by activating an assist operation when the difference between the first power supply voltage VDDCE and the second power supply voltage VDDPE increases. In addition, the memory device 100 may retain the level of the word-line driving voltage by deactivating the assist operation when the difference between the first power supply voltage VDDCE and the second power supply voltage VDDPE decreases.

In at least one example embodiment, the memory device 100 may decrease the level of the word-line driving voltage by activating an assist operation when the difference between the first power supply voltage VDDCE and the second power supply voltage VDDPE is greater than a reference value (or, reference voltage, desired reference voltage value, threshold reference voltage value, etc.). In addition, the memory device 100 may retain the level of the word-line driving voltage by deactivating assist operation when the difference between the first power supply voltage VDDCE and the second power supply voltage VDDPE is not greater than the reference value.

Figure 3:
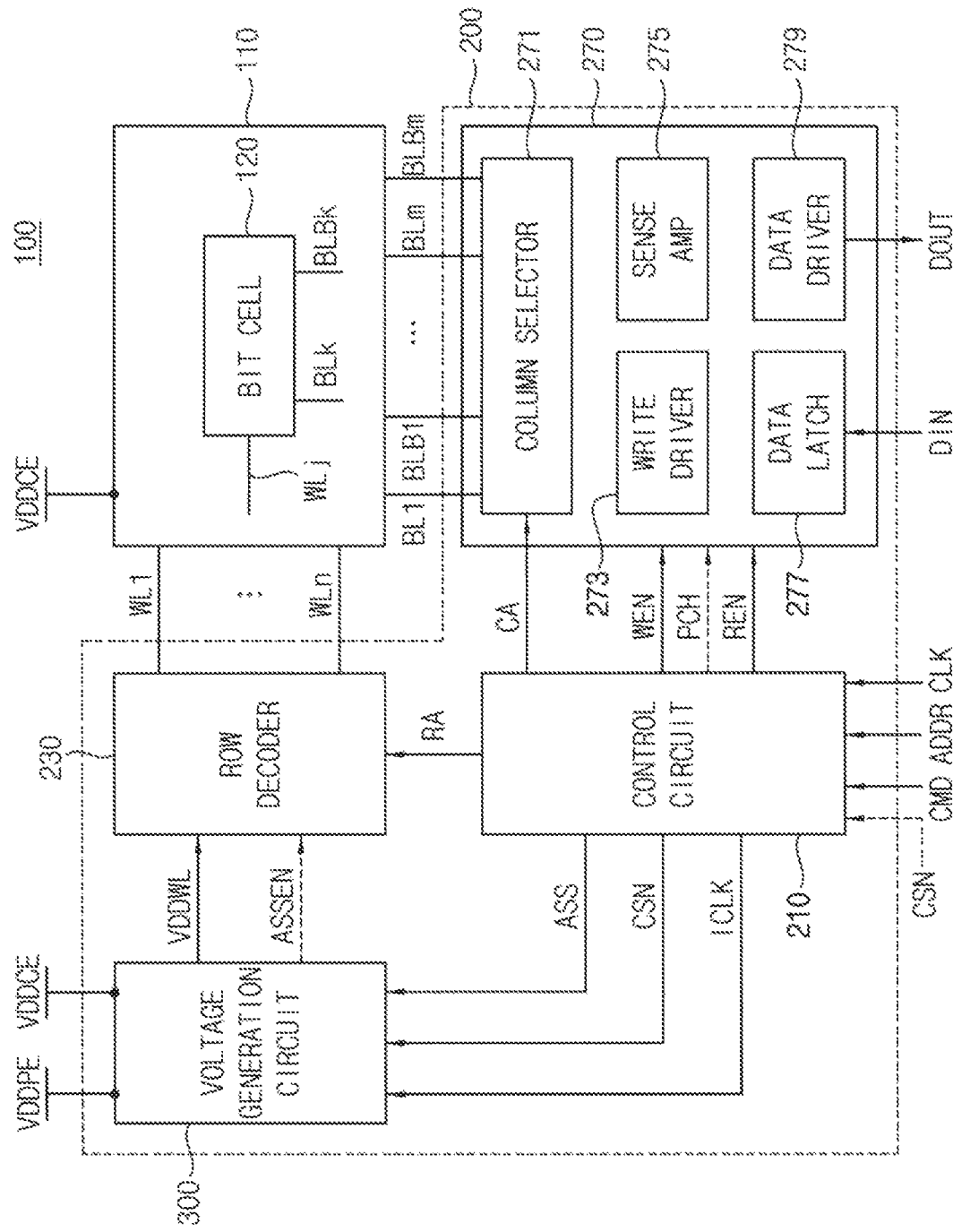
FIG. 3 is a block diagram illustrating an example of the memory device of FIG. 1 according to at least one example embodiment.

FIG. 3 is a block diagram illustrating an example of the memory device of FIG. 1 according to at least one example embodiment.

Referring to FIG. 3, the memory device 100 may include the memory cell array 110 that stores data and the peripheral circuit 200 that controls the memory cell array 110, but the example embodiments are not limited thereto. The memory cell array 110 and the peripheral circuit 200 may be supplied with different first and second power supply voltages VDDCE and VDDPE.

The memory cell array 110 may include a plurality of bit cells 120 that are arranged in a matrix having a plurality of rows and a plurality of columns. In at least one example embodiment, the memory device 100 may be a static random access memory (SRAM) device, and the bit cells 120 may be SRAM cells, but the example embodiments are not limited thereto.

The peripheral circuit 200 may include a control circuit 210, a row decoder 230, a data write/read circuit 270 and/or a voltage generation circuit 300, but is not limited thereto.

The row decoder 230 may be connected to the memory cell array 110 through a plurality of word-lines WL1~WLn, where n is an integer greater than two. The row decoder 230 may be controlled by the control circuit 210 to apply a word-line driving voltage to a selected word line WLj. The data write/read circuit 270 may be connected to the memory cell array through a plurality of bit-lines BL1~BLm and a plurality of complementary bit-lines BLB1~BLBm, where m is an integer greater than two. The data write/read circuit 270 may be controlled by the control circuit 210 to write data DIN provided from an external circuit, block, and/or device, etc., into the bit cell 120 coupled to the selected word line WLj and at least one selected pair of bit-lines BLk and BLBk, or to read data DOUT from the bit cell 120 to provide the data to the external circuit, block, and/or device, etc. Here, j is integer between 1 and n and k is an integer between 1 and m.

For example, the data write/read circuit 270 may include a column selector 271, a write driver 273, a sense amplifier 275, a data latch 277, and/or a data driver 279, etc., but is not limited thereto.

The data latch 277 receives the data DIN from the external circuit, block, device, etc. The write driver 273 writes the data DIN received by the data latch 277 into the bit cell 120. The column selector 271 selects at least one pair of bit-lines BLk and BLBk based on a received address signal ADDR. The sense amplifier 275 senses the data DOUT stored in the bit cell 120. The data driver 279 outputs the data DOUT sensed by the sense amplifier 275 to the external circuit, block, device, etc.

The control circuit 210 may control an operation of the memory device 100 by receiving an address (signal) ADDR, a command CMD, and a clock signal CLK from the external circuit, block, device, etc. The control circuit 210 may receive a chip selection signal CSN from the external circuit, block, device, etc.

The control circuit 210 may provide a row address RA to the row decoder 230 and may provide a column address CA to the column selector 271 of the address ADDR.

The voltage generation circuit 300 may be supplied with the first power supply voltage VDDCE and the second power supply voltage VDDPE, and may adjust a voltage level of the first word-line by adaptively adjusting a word-line power voltage VDDWL applied to the word-line driver that applies the word-line driving voltage to the first word-line coupled to the first bit cells, and/or by adjusting a level of an assist pulse signal ASSEN applied to a voltage adjusting transistor coupled to the first word-line according to the difference between the first power supply voltage VDDCE and the second power supply voltage VDDPE, in response to an internal clock signal ICLK, the chip selection signal CSN and/or an assist signal ASS.

The voltage generation circuit 300 may decrease the voltage level of the first word-line by decreasing a level of the word-line power voltage VDDWL, and/or a level of the assist pulse signal ASSEN, in proportion to (and/or based on) the difference between the first power supply voltage VDDCE and the second power supply voltage VDDPE when the first power supply voltage VDDCE is greater than the second power supply voltage VDDPE and the difference between the first power supply voltage VDDCE and the second power supply voltage VDDPE increases. Therefore, the memory device 100 may maintain operation performance and enhance the operation stability.

Figure 4:
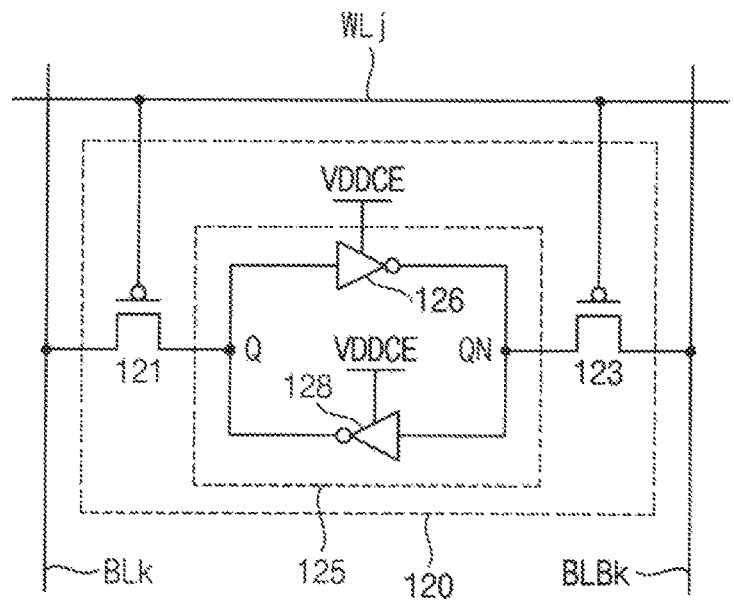
FIG. 4 is a circuit diagram illustrating one of the bit cells included in the memory device of FIG. 3 according to at least one example embodiment.

FIG. 4 is a circuit diagram illustrating one of the bit cells included in the memory device of FIG. 3 according to at least one example embodiment.

Referring to FIG. 4, the bit cell (or, a memory cell) 120 may include a first access transistor 121, a second access transistor 123, and/or a data storage circuit 125, etc., but the example embodiments are not limited thereto.

The data storage circuit 125 may store a single-bit of data. The data storage circuit 125 may include a first inverter 126 and a second inverter 128. An output terminal of the first inverter 126 is coupled to an input terminal of the second inverter 128, and an output terminal of the second inverter 128 is coupled to an input terminal of the first inverter 126. Therefore, the first inverter 126 and the second inverter 128 constitutes a latch circuit.

The first access transistor 121 may be connected between the k-th bit-line BLk and a first node Q coupled to the input terminal of the first inverter 126. The first access transistor 121 includes a gate coupled to the word-line WLj. The second access transistor 123 may be connected between the k-th complementary bit-line BLBk and a second node QN coupled to the input terminal of the second inverter 128. The second access transistor 123 includes a gate coupled to the word-line WLj.

The bit-line BLk and the complementary bit-line BLBk is precharged to the second power supply voltage VDDPE before a memory operation is performed on the bit cell 120. Therefore, the second power supply voltage VDDPE may denote a voltage of the bit-line BLk and the complementary bit-line BLBk before a data bit stored in the data storage circuit 125 is transferred to the bit-line BLk and the complementary bit-line BLBk. That is, the second power supply voltage VDDPE may denote a voltage of the bit-line BLk and the complementary bit-line BLBk.

Figure 5:
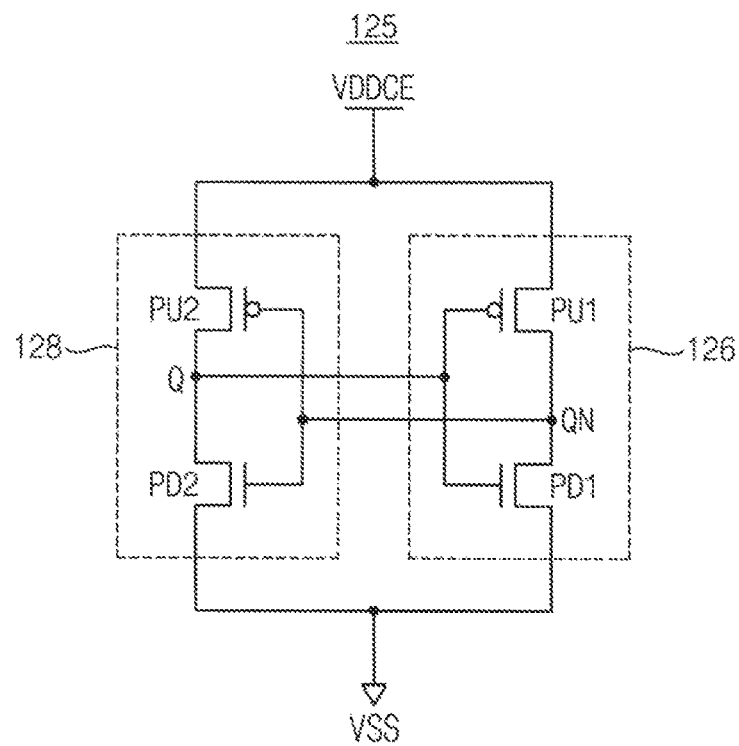
FIG. 5 is a circuit diagram illustrating a first inverter and a second inverter of the data storage circuit in FIG. 4 according to at least one example embodiment.

FIG. 5 is a circuit diagram illustrating a first inverter and a second inverter of the data storage circuit in FIG. 4 according to at least one example embodiment.

Referring to FIG. 5, the first inverter 126 includes a first pull-up transistor PU1 and a first pull-down transistor PD1, but is not limited thereto. The second inverter 128 includes a second pull-up transistor PU2 and a second pull-down transistor PD2, but is not limited thereto.

The first pull-up transistor PU1 may be a PMOS transistor that includes a source coupled to the first power supply voltage VDDCE, a drain coupled to the second node QN, and a gate coupled to the first node Q, but the example embodiments are not limited thereto. The first pull-down transistor PD1 may be a n-channel metal-oxide semiconductor (NMOS) transistor that includes a drain coupled to the second node QN, a source coupled to a ground voltage VSS, and a gate coupled to the first node Q, but the example embodiments are not limited thereto.

The second pull-up transistor PU2 may be a PMOS transistor that includes a source coupled to the first power supply voltage VDDCE, a drain coupled to the first node Q, and a gate coupled to the second node QN, but the example embodiments are not limited thereto. The second pull-down transistor PD2 may be an NMOS transistor that includes a drain coupled to the first node Q, a source coupled to the ground voltage VSS, and a gate coupled to the second node QN, but the example embodiments are not limited thereto. The first node Q may be coupled to the first access transistor 121 in FIG. 4 and the second node QN may be coupled to the second access transistor 123 in FIG. 4, but the example embodiments are not limited thereto.

Figure 6:
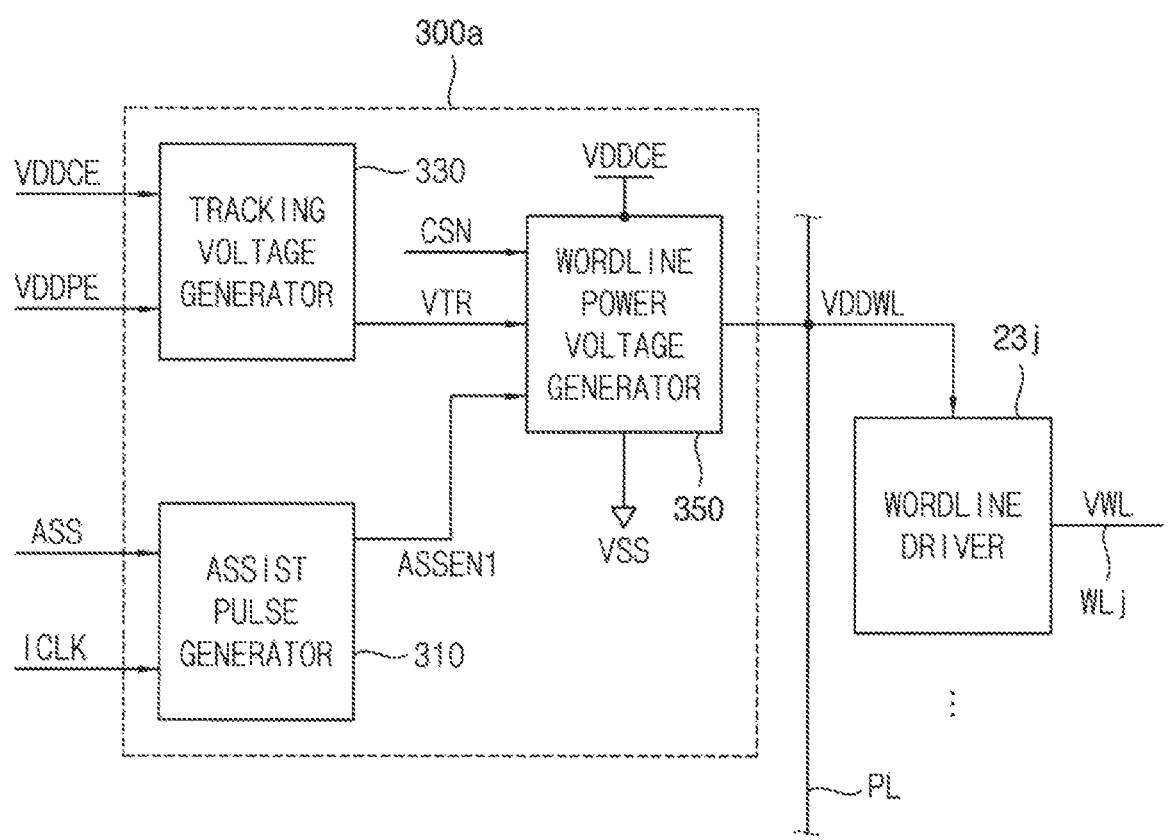
FIG. 6 is a block diagram illustrating an example of the voltage generation circuit in the memory device of FIG. 3 according to at least one example embodiment.

FIG. 6 is a block diagram illustrating an example of the voltage generation circuit in the memory device of FIG. 3 according to at least one example embodiment.

In FIG. 6, a word-line driver 23j is illustrated with a voltage generation circuit 300a for convenience of explanation and the word-line driver 23j applies a word-line driving voltage VWL to the word-line WLj, however the example embodiments are not limited thereto.

Referring to FIG. 6, the voltage generation circuit 300a may include an assist pulse generator 310, a tracking voltage generator 330, and at least one word-line power voltage generator 350, but is not limited thereto.

The assist pulse generator 310 may generate an assist pulse signal ASSEN1 in response to an assist signal ASS and/or an internal clock signal ICLK. Therefore, the assist pulse signal ASSEN1 may have an activation interval determined by the internal clock signal ICLK during the interval when the assist signal ASS has a first logic level (e.g., a logic high level, etc.). During the activation interval, the assist pulse signal ASSEN1 may be maintained at the first logic level. Accordingly, the assist pulse generator 310 may provide the assist pulse signal ASSEN1 to the word-line power voltage generator 350.

The tracking voltage generator 330 may receive the first power supply voltage VDDCE and the second power supply voltage VDDPE to generate a tracking voltage VTR reflecting the difference between the first power supply voltage VDDCE and the second power supply voltage VDDPE. The tracking voltage generator 330 may provide the tracking voltage VTR to the word-line power voltage generator 350. The tracking voltage generator 330 may generate the tracking voltage VTR whose level decreases in proportion to (and/or based on) the difference between the first power supply voltage VDDCE and the second power supply voltage VDDPE when the first power supply voltage VDDCE is greater than the second power supply voltage VDDPE.

The word-line power voltage generator 350 may be connected between the first power supply voltage VDDCE and the ground voltage VSS. Additionally, the word-line power voltage generator 350 may receive the chip selection signal CSN, the tracking voltage VTR, and the assist pulse signal ASSEN1, and may provide the word-line driver 23j through an internal power voltage line PL with a word-line power voltage VDDWL that has a level varying according to (and/or based on) a level of the tracking voltage VTR. The word-line driver 23j may be included in a row decoder, such as the row decoder 230 in FIG. 2, and the word-line driver 23j may generate the word-line driving voltage VWL that drives the word-line WLj based on the word-line power voltage VDDWL.

The word-line power voltage generator 350 may generate the word-line power voltage VDDWL whose level decreases in proportion to (and/or based on) the difference between the first power supply voltage VDDCE and the second power supply voltage VDDPE.

Figure 7:
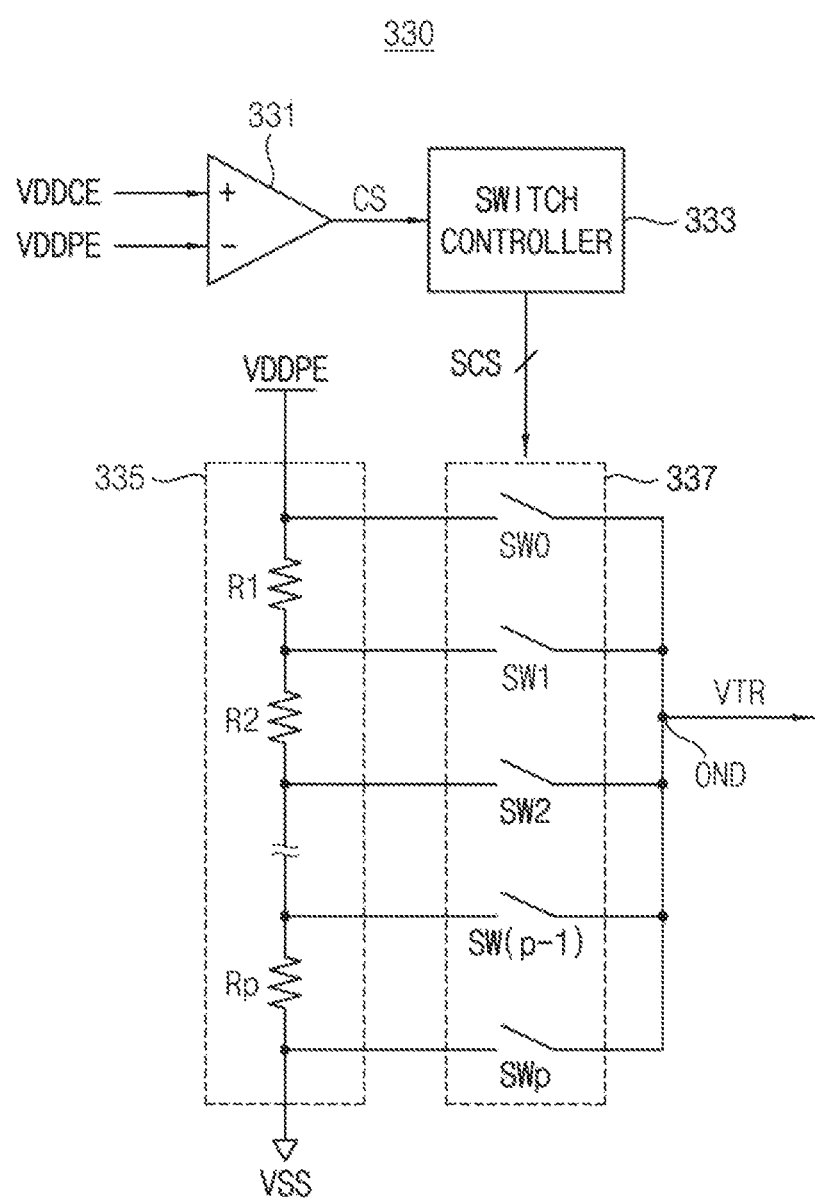
FIG. 7 is a circuit diagram illustrating an example of the tracking voltage generator in the voltage generation circuit of FIG. 6 according to at least one example embodiment.

FIG. 7 is a circuit diagram illustrating an example of the tracking voltage generator in the voltage generation circuit of FIG. 6 according to at least one example embodiment.

Referring to FIG. 7, the tracking voltage generator 330 may include an operational amplifier (and/or, a comparator, etc.) 331, a switch controller 333, a voltage divider 335 and/or a switch circuit 337, etc., but is not limited thereto.

The operational amplifier 331 may compare the first power supply voltage VDDCE and the second power supply voltage VDDPE to output a comparison signal CS corresponding to (and/or based on) the difference between the first power supply voltage VDDCE and the second power supply voltage VDDPE. The switch controller 333 may receive the comparison signal CS to output, to the switch circuit 337, a switching control signal SCS reflecting the difference between the first power supply voltage VDDCE and the second power supply voltage VDDPE, but is not limited thereto.

The voltage divider 335 may include a plurality of resistors R1~Rp (where p is a natural number greater than two) connected in series between the second power supply voltage VDDPE and the ground voltage VSS. The switch circuit 337 may include a plurality of switches SW0 and SW1~SWp. The plurality of switches SW0 and SW1~SWp may be connected in parallel between two ends of the plurality of resistors R1~Rp and an output node OND. The plurality of switches SW0 and SW1~SWp may be selectively turned-on in response to the bits of the switching control signal SCS to provide the tracking voltage VTR at the output node OND. Therefore, the tracking voltage VTR may have a level that swings between the second power supply voltage VDDPE and the ground voltage VSS.

For example, when the first power supply voltage VDDCE is significantly higher (e.g., higher than a desired "high" threshold value, or is a desired number of multiples higher, etc.) than the second power supply voltage VDDPE, the switch circuit 337 may output the tracking voltage VTR whose level is near the ground voltage VSS in response to the switching control signal SCS. For example, when the first power supply voltage VDDCE is substantially the same (e.g., equal to and/or within a desired value range, etc.) as the second power supply voltage VDDPE, the switch circuit 337 may output the tracking voltage VTR whose level is near the second power supply voltage VDDPE in response to the switching control signal SCS.

Figure 8:
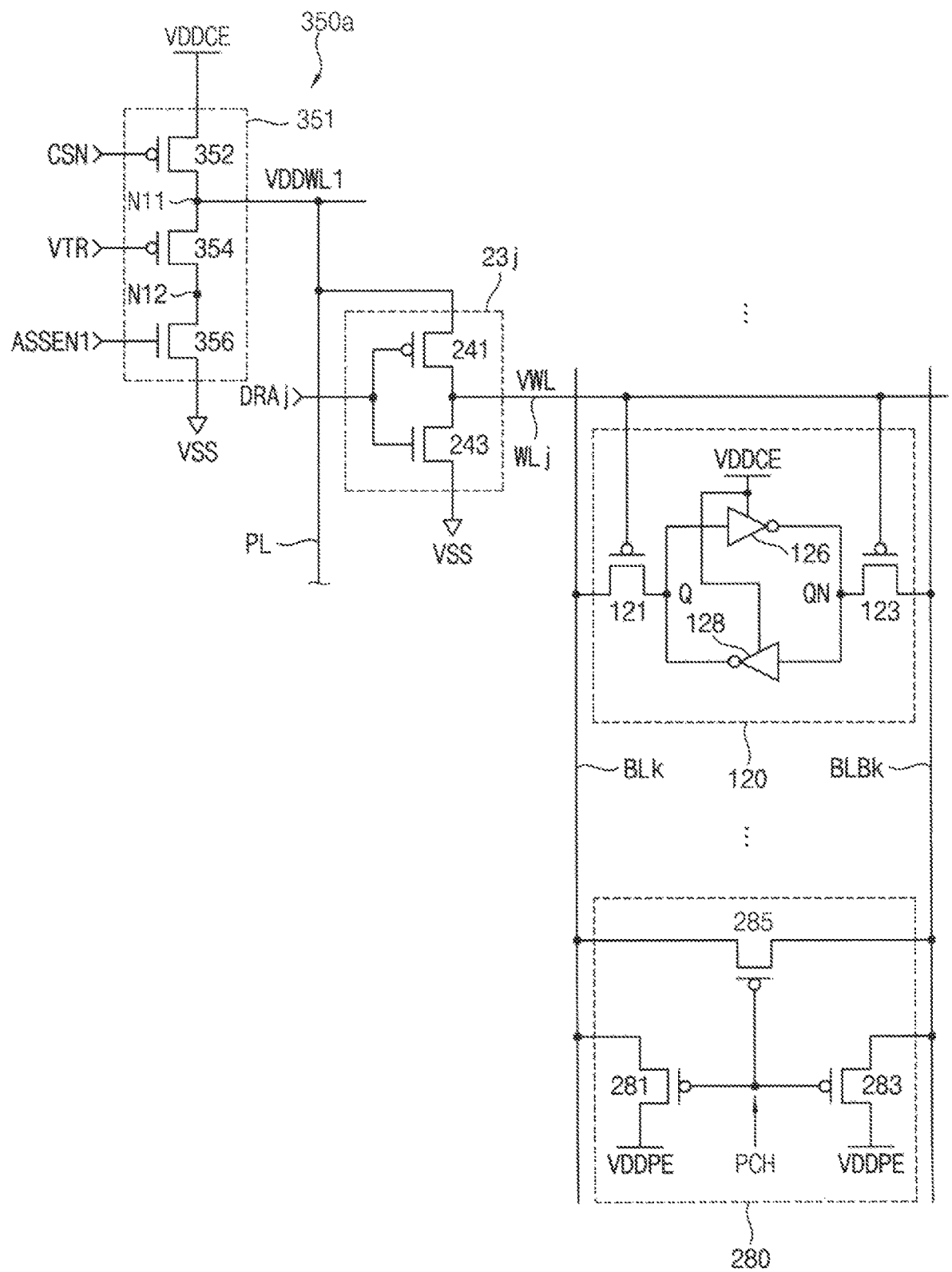
FIG. 8 is a circuit diagram illustrating an example of the at least one word-line power voltage generator in the voltage generation circuit of FIG. 6 according to at least one example embodiment.

FIG. 8 is a circuit diagram illustrating an example of the at least one word-line power voltage generator in the voltage generation circuit of FIG. 6 according to at least one example embodiment.

In FIG. 8, the word-line driver 23j coupled to the word-line WLj, the bit cell 120 and the precharge circuit 280 are illustrated with at least one word-line power voltage generator 350a for convenience of explanation. However, the example embodiments are not limited thereto and may include, for example, a plurality of word-line power voltage generators, etc.

Referring to FIG. 8, the word-line power voltage generator 350 may include a first word-line power voltage generator 351. The first word-line power voltage generator 351 may apply a word-line power voltage VDDWL1 to a first end of the internal power voltage line PL. According to at least one example embodiment, the first word-line power voltage generator 351 may include a first PMOS transistor 352, a second PMOS transistor 354, and an NMOS transistor 356 connected in series between the first power supply voltage VDDCE and the ground voltage VSS, but the example embodiments are not limited thereto.

The first PMOS transistor 352 includes a source coupled to the first power supply voltage VDDCE, a gate receiving the chip selection signal CSN, and a drain coupled to a first node N11. The second PMOS transistor 354 includes a source coupled to the first node N11, a gate receiving the tracking voltage VTR, and a drain coupled to a second node N12. The NMOS transistor 356 includes a drain coupled to the second node N12, a gate receiving the assist pulse signal ASSEN1, and a source coupled to the ground voltage VSS.

The first word-line power voltage generator 351 provides a word-line power voltage VDDWL1 at the first node N11, and the chip selection signal CSN has a second logic level during a write operation and/or a read operation of the memory device 100. Therefore, the level of the word-line power supply voltage VDDWL1 may vary in response to a level of the tracking voltage VTR which is applied to the gate of the second PMOS transistor 354 during the assist interval during which the assist pulse signal ASSEN1 is enabled with a first logic level.

The word-line driver 23j may output the word-line driving voltage VWL by inverting a logic level of a decoded row address DRAj, based on the word-line power voltage VDDWL1.

The precharge circuit 280 is coupled between the k-th bit-line BLk and the k-th complementary bit-line BLBk, and the precharge circuit 280 includes a plurality of PMOS transistors, such as PMOS transistors 281, 283 and 285, but the example embodiments are not limited thereto.

The PMOS transistor 281 includes a source coupled to the second power supply voltage VDDPE, a gate receiving a precharge signal PCH, and a drain coupled to the k-th bit-line BLk. The PMOS transistor 283 includes a source coupled to the second power supply voltage VDDPE, a gate receiving the precharge signal PCH, and a drain coupled to the k-th complementary bit-line BLBk. The PMOS transistor 285 includes a source coupled to the k-th bit-line BLk, a drain coupled to the k-th complementary bit-line BLBk, and a gate receiving the precharge signal PCH. The precharge circuit 280 precharges the k-th bit-line BLk and the k-th complementary bit-line BLBk with a level of the second power supply voltage VDDPE, in response to the precharge signal PCH. The control circuit 210 may provide the precharge signal PCH to the precharge circuit 280.

Figure 9:
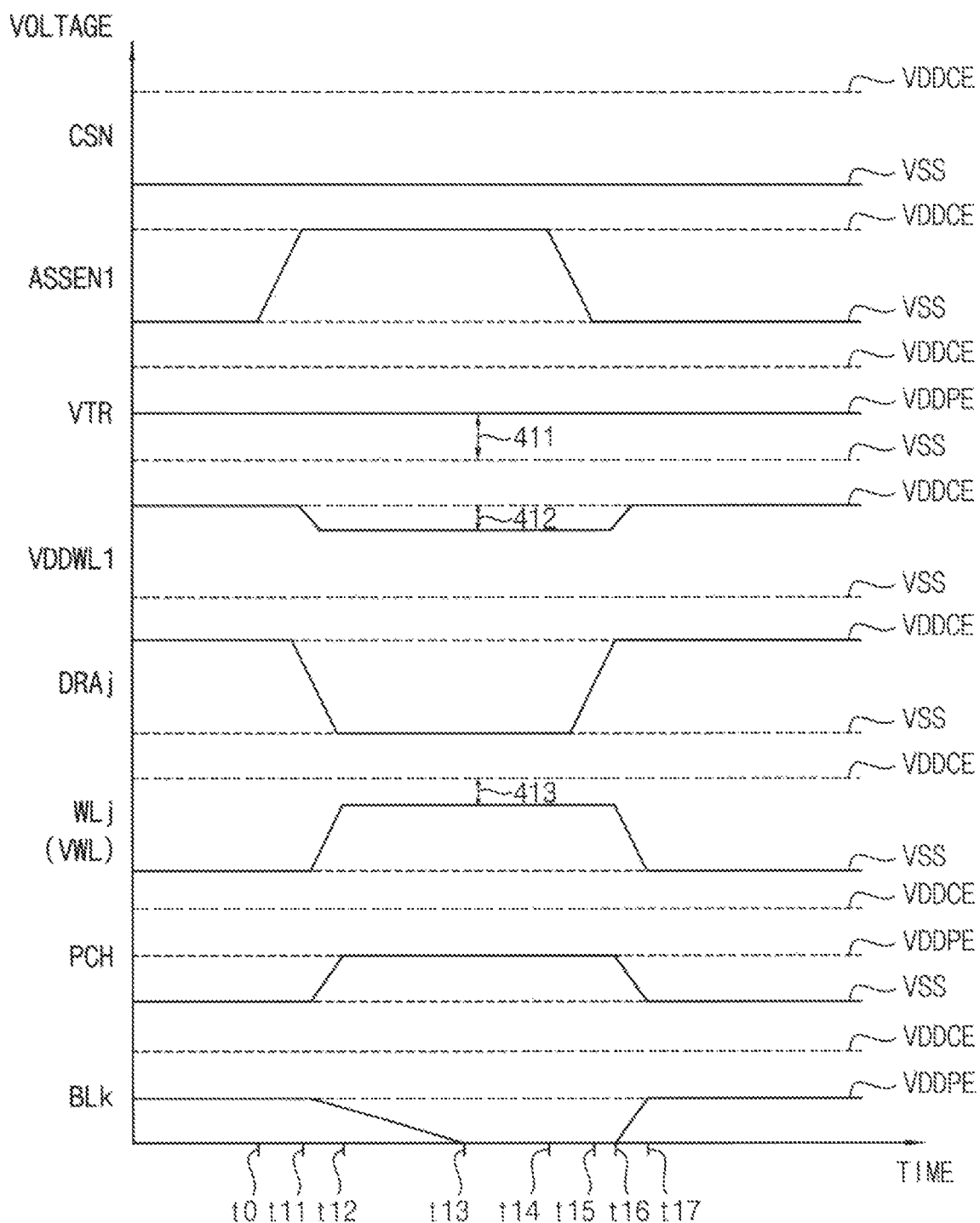
FIG. 9 is a timing diagram illustrating an operation of a portion of the memory device of FIG. 3, which is shown in FIG. 8, according to at least one example embodiment.

FIG. 9 is a timing diagram illustrating an operation of a portion of the memory device of FIG. 3, which is shown in FIG. 8, according to at least one example embodiment.

In FIG. 9, it is assumed that the chip selection signal CSN has a second logic level during the write operation and the read operation of the memory device 100. Therefore, the first PMOS transistor 352 is conducting during the operation in FIG. 9. However, the example embodiments are not limited thereto.

Referring to FIGS. 3 through 9, the assist pulse signal ASSEN1 begins to transition at a timing point t0, transitions to a first logic level (VDDCE) at a timing point t11, maintains the first logic level VDDCE until a timing point t14, and transitions to a second logic level VSS at a timing point t15. Therefore, between the timing point t11 and the timing point t16 when the assist pulse signal ASSEN1 is maintained at the first logic level VDDCE, the NMOS transistor 355 is turned-on, a level of the word-line power voltage VDDWL1 varies (as indicated by reference numeral 412) in response to the tracking voltage VTR varying (as indicated by reference numeral 411), which is applied to the gate of the PMOS transistor 353.

The word-line driver 23j outputs the word-line driving voltage VWL by inverting a logic level of the decoded row address DRAj, and a level of the word-line driving voltage VWL varies between the level of the first power supply voltage VDDCE and a level higher than the ground voltage VSS, between the timing point t12 and the timing point t16 (as indicated by reference numeral 413) in response to a variation of the word-line power voltage VDDWL1.

The precharge signal PCH transitions to a first logic level (VDDPE) at the timing point t12 and transitions to a second logic level at the timing point t17. The k-th bit-line transitions to a second logic level at the timing point t13 in response to the precharge signal PCH transitioning to a first logic level. The k-th bit-line is precharged to a first logic level (VDDPE) at a timing t17 in response to the precharge signal PCH transitioning to a second logic level.

Figure 10:
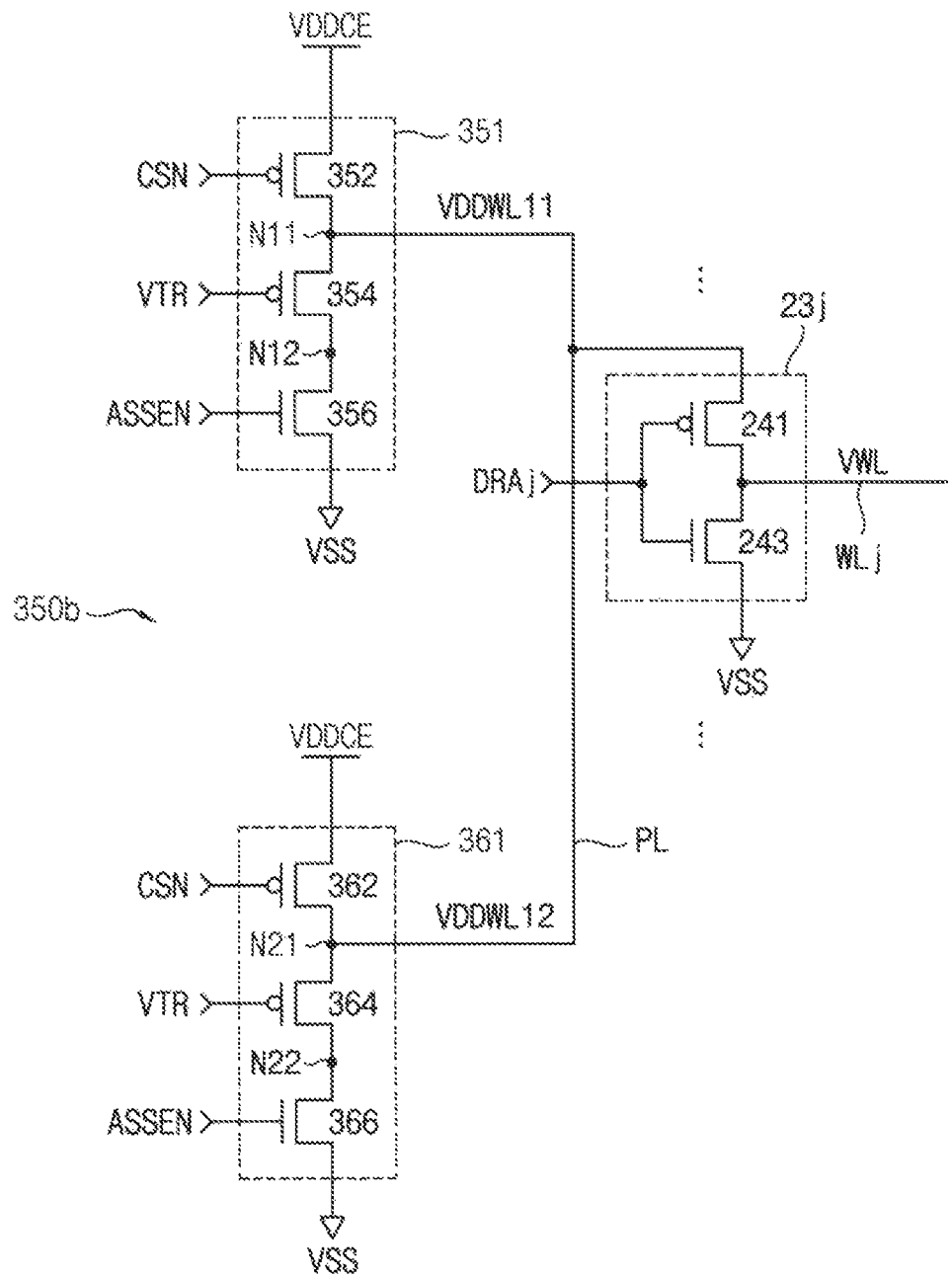
FIG. 10 is a circuit diagram illustrating another example of the at least one word-line power voltage generator in the voltage generation circuit of FIG. 6 according to at least one example embodiment.

FIG. 10 is a circuit diagram illustrating another example of the at least one word-line power voltage generator in the voltage generation circuit of FIG. 6 according to at least one example embodiment.

Referring to FIG. 10, at least one word-line power voltage generator 350b may include a first word-line power voltage generator 351 and a second word-line power voltage generator 361, but the example embodiments are not limited thereto. The first word-line power voltage generator 351 is connected to a first end of the internal power voltage line PL and the second word-line power voltage generator 361 is connected to a second end of the internal power voltage line PL.

The first word-line power voltage generator 351 may output a first word-line power voltage VDDWL11 to the first end of the internal power voltage line PL at a first node N11 and the second word-line power voltage generator 361 may output a second word-line power voltage VDDWL12 to the second end of the internal power voltage line PL at a first node N21. A level of the first word-line power voltage VDDWL11 may be substantially the same (e.g., equal to and/or within a desired value range, etc.) as a level of the second word-line power voltage VDDWL12.

The second word-line power voltage generator 361 may include a first PMOS transistor 362, a second PMOS transistor 364, and an NMOS transistor 366 connected in series between the first power supply voltage VDDCE and the ground voltage VSS, but the example embodiments are not limited thereto.

The first PMOS transistor 362 includes a source coupled to the first power supply voltage VDDCE, a gate receiving the chip selection signal CSN, and a drain coupled to a first node N21. The second PMOS transistor 364 includes a source coupled the first node N21, a gate receiving the tracking voltage VTR, and a drain coupled to a second node N22. The NMOS transistor 366 includes a drain coupled to the second node N22, a gate receiving the assist pulse signal ASSEN1, and a source coupled to the ground voltage VSS.

When the word-line power voltage generator 350 in FIG. 6 employs the word-line power voltage generator 350b in FIG. 10, the operation of the memory device 100 is substantially similar to the timing diagram shown in FIG. 8. In addition, when word-line power voltage generator 350 in FIG. 6 employs the word-line power voltage generator 350b in FIG. 10, a variance of the level of the word-line power voltage VDDWL generated due to position of the bit cells 120 in the memory cell array 110 may be reduced and/or minimized.

Figure 11:
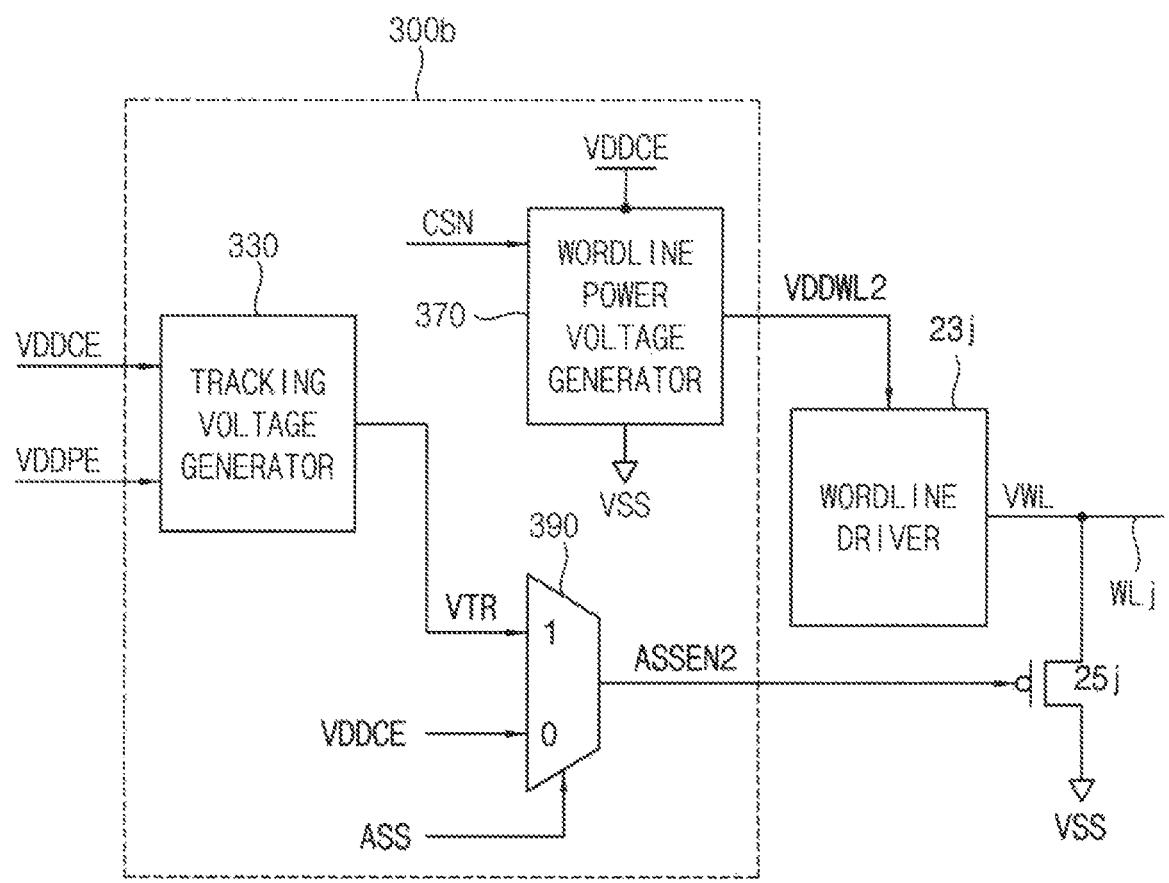
FIG. 11 is a block diagram illustrating another example of the voltage generation circuit in the memory device of FIG. 3 according to at least one example embodiment.

FIG. 11 is a block diagram illustrating another example of the voltage generation circuit in the memory device of FIG. 3 according to at least one example embodiment.

In FIG. 11, the word-line driver 23j and a voltage adjusting transistor 25j are illustrated with a voltage generation circuit 300b for the sake of convenience of explanation and the word-line driver 23j applies the word-line driving voltage VWL to the word-line WLj, but the example embodiments are not limited thereto.

Referring to FIG. 11, the voltage generation circuit 300b may include a tracking voltage generator 330, at least one word-line power voltage generator 370 and a selection circuit 390, etc., but the example embodiments are not limited thereto.

The tracking voltage generator 330 may receive the first power supply voltage VDDCE and the second power supply voltage VDDPE to generate the tracking voltage VTR reflecting the difference between the first power supply voltage VDDCE and the second power supply voltage VDDPE. The tracking voltage generator 330 may provide the tracking voltage VTR to the selection circuit 390.

At least one word-line power voltage generator 370 may be connected between the first power supply voltage VDDCE and the ground voltage VSS, may receive the chip selection signal CSN, and may provide the word-line driver 23j with a word-line power voltage VDDWL2.

The selection circuit 390 may receive the tracking voltage VTR and the first power supply voltage VDDCE, may select one of the tracking voltage VTR and the first power supply voltage VDDCE in response to the assist signal ASS as an assist pulse signal ASSEN2, and may apply the assist pulse signal ASSEN2 to a gate of the voltage adjusting transistor 25j coupled to the word-line WLj.

When the assist signal ASS has a first logic level, the selection circuit 390 outputs the tracking voltage VTR as the assist pulse signal ASSEN2. When the assist signal ASS has a second logic level, the selection circuit 390 outputs the first power supply voltage VDDCE as the assist pulse signal ASSEN2.

As described with reference to FIG. 7, the tracking voltage generator 330 generates the tracking voltage VTR whose level decreases in proportion to (and/or based on) the difference between the first power supply voltage VDDCE and the second power supply voltage VDDPE. Therefore, the voltage generation circuit 300b applies the tracking voltage VTR to the gate of the voltage adjusting transistor 25j during the assist interval in which the assist signal ASS has a first logic level. Accordingly, the word-line driving voltage VWL on the word-line WLj decreases in proportion to (and/or based on) the difference between the first power supply voltage VDDCE and the second power supply voltage VDDPE, because the voltage adjusting transistor 25j sinks a current to the ground voltage VSS in response to the tracking voltage VTR.

Figure 12:
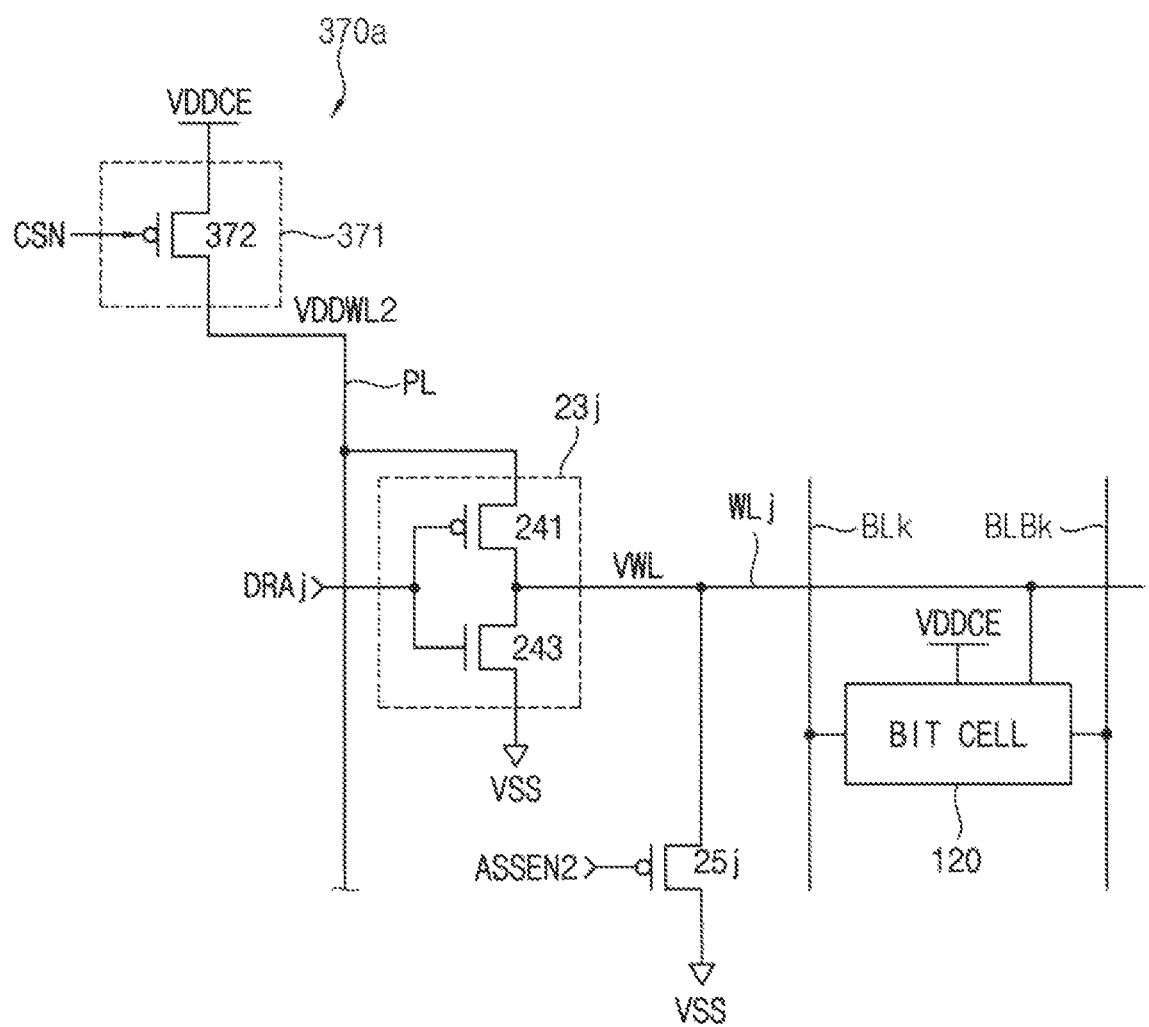
FIG. 12 is a circuit diagram illustrating an example of the at least one word-line power voltage generator in the voltage generation circuit of FIG. 11 according to at least one example embodiment.

FIG. 12 is a circuit diagram illustrating an example of the at least one word-line power voltage generator in the voltage generation circuit of FIG. 11 according to at least one example embodiment.

In FIG. 12, the word-line driver 23j coupled to the word-line WLj, the bit cell 120 and the voltage adjusting transistor 25j are illustrated with at least one power voltage generator 370a for the sake of convenience of explanation, but the example embodiments are not limited thereto.

Referring to FIG. 12, the at least one power voltage generator 370a may include a first word-line power voltage generator 371, but is not limited thereto. The first word-line power voltage generator 371 may provide the word-line power voltage VDDWL2 to the first end of the internal power voltage line PL.

The first word-line power voltage generator 371 may include a PMOS transistor 372, etc. The PMOS transistor 372 includes a source coupled to the first power supply voltage VDDCE, a gate receiving the chip selection signal CSN, and a drain coupled to the first end of the internal power voltage line PL. Since the chip selection signal CSN has a second logic level during the write operation and the read operation of the memory device 100, the word-line power voltage VDDWL2 has a regular level during the write operation and the read operation of the memory device 100.

The word-line driver 23j may output the word-line driving voltage VWL by inverting a logic level of a decoded row address DRAj, based on the word-line power voltage VDDWL2.

The voltage adjusting transistor 25j may employ at least one PMOS transistor that includes a source coupled to the word-line WLj, a gate receiving the assist pulse signal ASSEN2, and a drain coupled to the ground voltage VSS. Therefore, the voltage generation circuit 300b applies the tracking voltage VTR to the gate of the voltage adjusting transistor 25j during the assist interval in which the assist signal ASS has a first logic level. Accordingly, the word-line driving voltage VWL on the word-line WLj decreases in proportion to (and/or based on) the difference between the first power supply voltage VDDCE and the second power supply voltage VDDPE, because the voltage adjusting transistor 25j sinks a current to the ground voltage VSS in response to the tracking voltage VTR.

Figure 13:
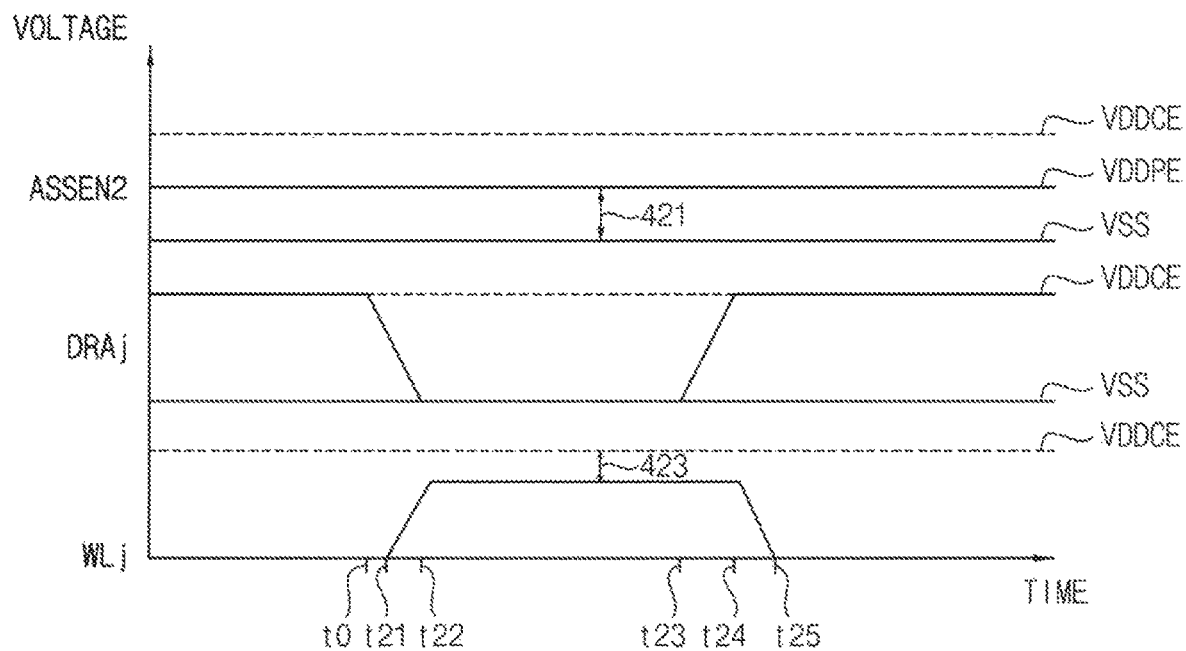
FIG. 13 is a timing diagram illustrating an operation of a portion of the memory device of FIG. 3, which is shown in FIG. 12, according to at least one example embodiment.

FIG. 13 is a timing diagram illustrating an operation of a portion of the memory device of FIG. 3, which is shown in FIG. 12, according to at least one example embodiment.

In FIG. 13, it is assumed that the chip selection signal CSN has a second logic level during the write operation and the read operation of the memory device 100. Therefore, the PMOS transistor 372 is conducting during the operation in FIG. 13.

Referring to FIGS. 3 through 5, 7, and 11 through 13, the selection circuit 390 provides the tracking voltage VTR as the assist pulse signal ASSEN2 to the gate of the voltage adjusting transistor 25j during an assist interval in which the assist signal ASS has a first logic level. Therefore, during the assist interval, the word-line driving voltage VWL on the word-line WLj decreases in proportion to (and/or based on) the difference between the first power supply voltage VDDCE and the second power supply voltage VDDPE. Referring to FIG. 13, the level of the assist pulse signal ASSEN2 varies from the ground voltage VSS to the second power supply voltage VDDPE between timing points t0~t25 as indicated by reference numeral 421.

The decoded row address DRAj begins to transition at the timing point t0, transitions to a second logic level VSS at the timing point t22, maintains the second logic level VSS until the timing point t23, and transitions to a first logic level VDDCE at the timing point t24. The voltage level of the word-line WLj begins to transition from the second logic level VSS at the timing point t21, transitions to a first logic level VDDCE at the timing point t22, maintains the first logic level VDDCE until the timing point t24, and transitions to a second logic level VSS at the timing point t25 in response to the transition of the decoded row address DRAj.

The voltage level of the word-line WLj varies as a reference numeral 423 indicates in response to variance of the assist pulse signal ASSEN2.

Figure 14:
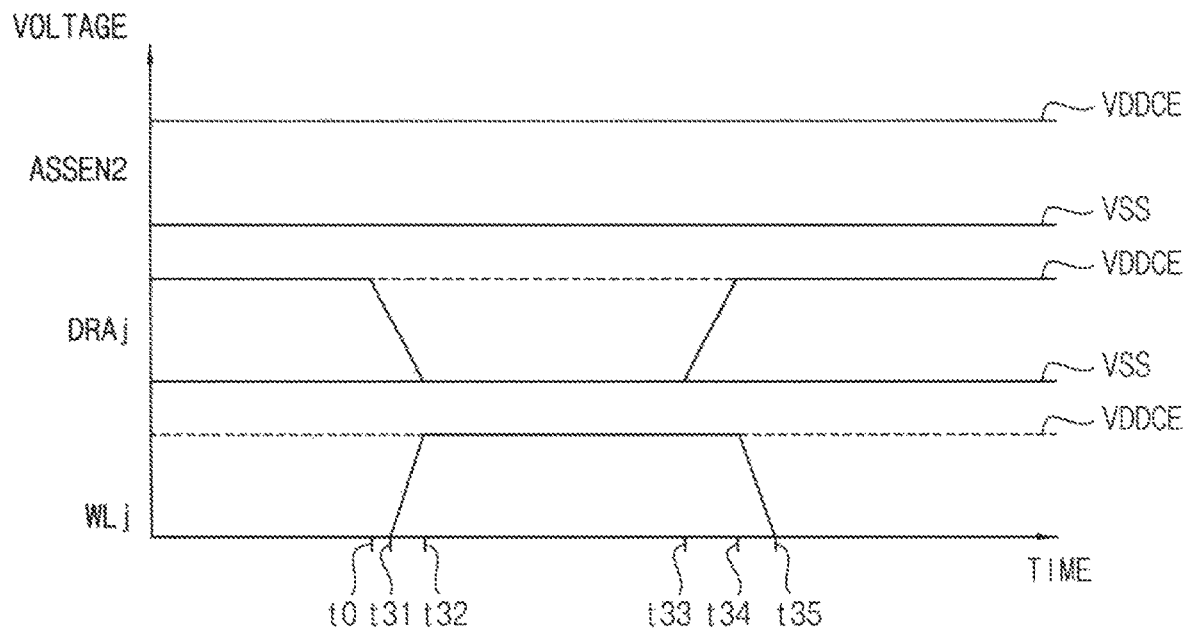
FIG. 14 is a timing diagram illustrating an operation of a portion of the memory device of FIG. 3, which is shown in FIG. 12, according to at least one example embodiment.

FIG. 14 is a timing diagram illustrating an operation of a portion of the memory device of FIG. 3, which is shown in FIG. 12, according to at least one example embodiment.

In FIG. 14, it is assumed that the chip selection signal CSN has a second logic level during the write operation and the read operation of the memory device 100. Therefore, the PMOS transistor 372 is conducting during the operation in FIG. 13.

Referring to FIGS. 3 through 5, 7, 11, 12 and 14, the selection circuit 390 provides the first power supply voltage VDDCE as the assist pulse signal ASSEN2 to the gate of the voltage adjusting transistor 25j during a non-assist interval in which the assist signal ASS has a second logic level. Therefore, during the non-assist interval, the voltage adjusting transistor 25j is turned-off and the word-line driving voltage VWL on the word-line WLj is maintained with the first power supply voltage VDDCE irrespective of the difference between the first power supply voltage VDDCE and the second power supply voltage VDDPE.

Referring to FIG. 14, the decoded row address DRAj begins to transition at the timing point t0 from a first logic level VDDCE, transitions to a second logic level VSS at the timing point t32, maintains the second logic level VSS until the timing point t33, and transitions to a first logic level VDDCE at the timing point t34. The voltage level of the word-line WLj begins to transition from the second logic level VSS at the timing point t31, transitions to a first logic level VDDCE at the timing point t32, maintains the first logic level VDDCE until the timing point t34, and transitions to a second logic level VSS at the timing point t35 in response to the transition of the decoded row address DRAj.

Figure 15:
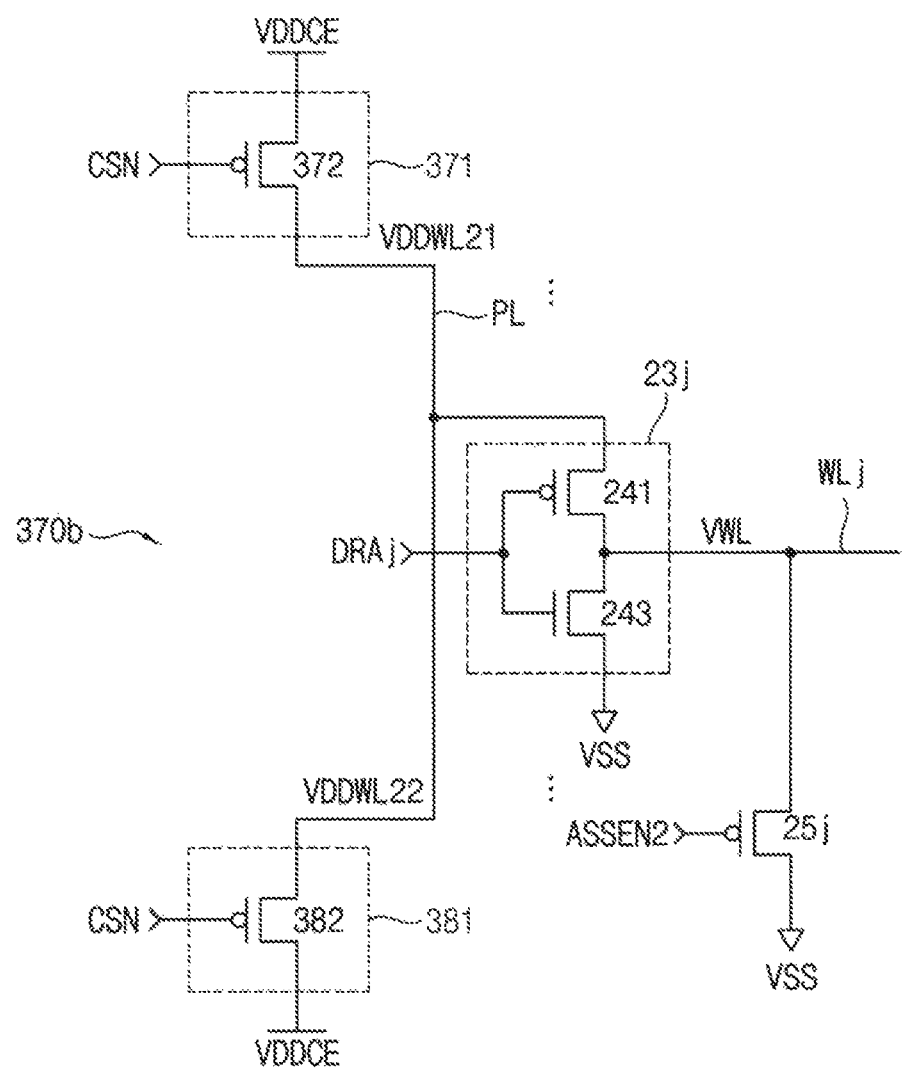
FIG. 15 is a circuit diagram illustrating another example of the at least one word-line power voltage generator in the voltage generation circuit of FIG. 11 according to at least one example embodiment.

FIG. 15 is a circuit diagram illustrating another example of the at least one word-line power voltage generator in the voltage generation circuit of FIG. 11 according to at least one example embodiment.

Referring to FIG. 15, at least one word-line power voltage generator 370b may include a first word-line power voltage generator 371 and a second word-line power voltage generator 381, but is not limited thereto. The first word-line power voltage generator 371 is connected to a first end of the internal power voltage line PL and the second word-line power voltage generator 381 is connected to a second end of the internal power voltage line PL.

The first word-line power voltage generator 371 may output a first word-line power voltage VDDWL21 to the first end of the internal power voltage line PL and the second word-line power voltage generator 381 may output a second word-line power voltage VDDWL22 to the second end of the internal power voltage line PL. A level of the first word-line power voltage VDDWL21 may be substantially the same (e.g., equal to and/or within a desired value range, etc.) as a level of the second word-line power voltage VDDWL22.

The second word-line power voltage generator 368 may include a PMOS transistor 382, but is not limited thereto. The PMOS transistor 382 includes a source coupled to the first power supply voltage VDDCE, a gate receiving the chip selections signal CSN, and a drain coupled to the second end of the internal power voltage line PL.

When the word-line power voltage generator 370 in FIG. 11 employs the word-line power voltage generator 370b in FIG. 15, the operation of the memory device 100 is substantially similar to timing diagrams shown in FIGS. 13 and 14. In addition, when word-line power voltage generator 370 in FIG. 11 employs the word-line power voltage generator 370b in FIG. 15, a variance of the level of the word-line power voltage VDDWL generated due to position of the bit cells 120 in the memory cell array 110 may be reduced and/or minimized.

Figure 16:
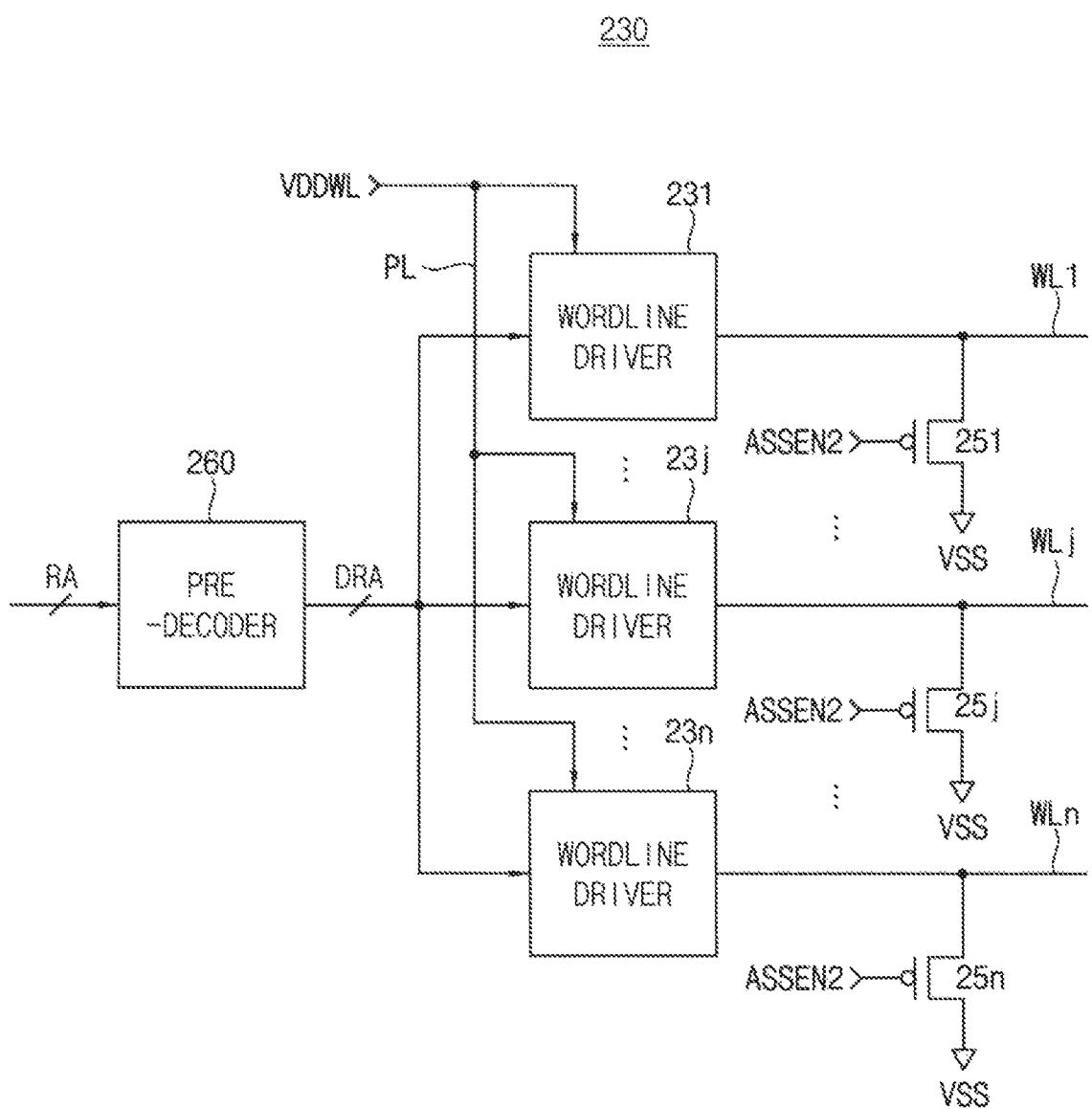
FIG. 16 is a block diagram illustrating an example of the row decoder in the memory device of FIG. 3 according to at least one example embodiment.

FIG. 16 is a block diagram illustrating an example of the row decoder in the memory device of FIG. 3 according to at least one example embodiment.

Referring to FIG. 16, the row decoder 230 may include at least one pre-decoder 260 and a plurality of word-line drivers 231~23n, but is not limited thereto.

Each of the plurality of word-line drivers 231~23n are connected to a corresponding one of the word-lines WL1~WLn, and the plurality of word-line drivers 231~23n may apply the word-line driving voltage VWL to at least one selected word-line of the plurality of word-line drivers 231~23n. Each of the plurality of word-line drivers 231~23n may be supplied with the word-line power voltage VDDWL from one of the word-line power voltage generator 350a, such as the word-line power voltage generators of FIG. 8, the word-line power voltage generator 350b of FIG. 10, the word-line power voltage generator 370a of FIG. 12, the word-line power voltage generator 370b of FIG. 15, etc., through the internal power voltage line PL.

In at least one example embodiment, the row decoder 230 may further include a plurality of voltage adjusting transistors 251~25n coupled to the plurality of word-lines WL1~WLn, respectively.

The pre-decoder 260 may decode the row address RA to provide a decoded row address DRA to the plurality of word-line drivers 231~23n. At least one of the plurality of word-line drivers 231~23n, which receives a bit having a second logic level of bits of the decoded row address DRA, may drive a corresponding word-line with the word-line driving voltage based on the word-line power voltage VDDWL.

As mentioned above, since the level of the word-line power voltage VDDWL varies according to the difference between the first power supply voltage VDDCE and the second power supply voltage VDDPE, and/or the level of the assist pulse signal ASSEN2 varies according to the difference between the first power supply voltage VDDCE and the second power supply voltage VDDPE, the memory device 100 may ensure the operation stability in the read operation by decreasing the level of the word-line driving voltage VWL in proportion to (and/or based on) the difference between the first power supply voltage VDDCE and the second power supply voltage VDDPE during the assist interval in which the assist signal ASS has a first logic level.

Figure 17:
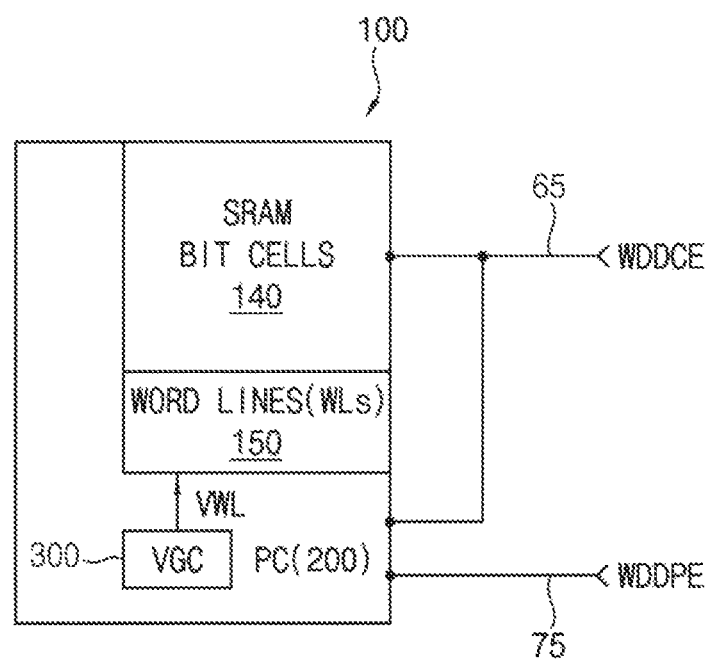
FIG. 17 illustrates a duel power rail memory device according to at least one example embodiment.

FIG. 17 illustrates a duel power rail memory device according to at least one example embodiment.

Referring to FIG. 17, the memory device 100 includes bit cells 140, word-lines 150 and/or a peripheral circuit 200, etc., and the peripheral circuit 200 may include a voltage generation circuit 300. However, the example embodiments are not limited thereto.

The bit cells 120 are supplied with the a first power supply voltage VDDCE through a first power supply line 65 to store data, and the peripheral circuit 200 is be supplied with a second power supply voltage VDDPE through a second power supply line 75 to control the bit cells 120. The voltage generation circuit 300 is supplied with the first power supply voltage VDDCE and the second power supply voltage VDDPE, and adaptively adjusts a word-line driving voltage VWL, which is applied to the word-lines 150, directly or indirectly according to (and/or based on) a difference between the first power supply voltage VDDCE and the second power supply voltage VDDPE. Thus, the voltage generation circuit 300 may ensure the operation stability of the memory device 100.

Figure 18:
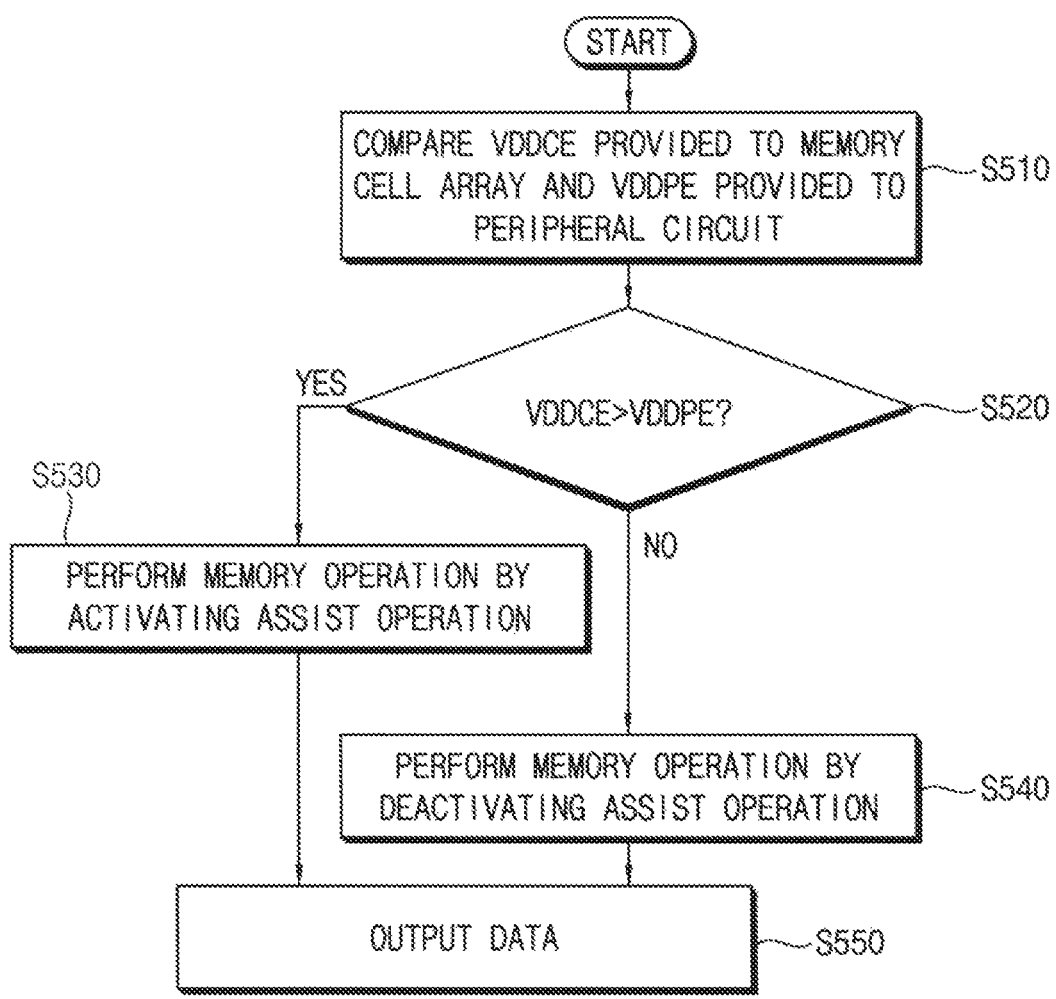
FIG. 18 is a flowchart illustrating a method of operating a memory device of FIG. 1 according to at least one example embodiment.

FIG. 18 is a flowchart illustrating a method of operating a memory device of FIG. 1 according to at least one example embodiment.

Referring to FIGS. 1 through 18, in a method of operating the memory device 100 to store data, the memory device 100 including the memory cell array 110 and the memory cell array 110 including a plurality of bit cells 120, and/or a method of operating the peripheral circuit 200 to control the memory cell array 110, a voltage generation circuit 300 compares a first power supply voltage VDDCE provided to the memory cell array 110 and a second power supply voltage VDDPE provided to the peripheral circuit 200 (S510).

The voltage generation circuit 300 adaptively adjusts a word-line driving voltage VWL, which is applied to a first word-line coupled to first bits cells selected from the bit cells 120, directly or indirectly according to a difference between the first power supply voltage VDDCE and the second power supply voltage VDDPE based on the results of the comparison (S520, S530, S540).

For adaptively adjusting the word-line driving voltage VWL applied to the first word-line directly or indirectly, the voltage generation circuit 300 determines whether the first power supply voltage VDDCE is greater than the second power supply voltage VDDPE (S520). Alternatively, the voltage generation circuit 300 may determine whether the difference between the first power supply voltage VDDCE and the second power supply voltage VDDPE is greater than a reference voltage.

When the first power supply voltage VDDCE is smaller than or equal to the second power supply voltage VDDPE (NO in S520), or alternatively when the difference between the first power supply voltage VDDCE and the second power supply voltage VDDPE is not greater than the reference voltage, a memory operation (e.g., a write operation, a read operation, etc.) is performed on the first bit cells with maintaining the word-line driving voltage VWL (i.e., by deactivating the assist function) without regard to the difference between the first power supply voltage VDDCE and the second power supply voltage VDDPE (S540).

When the first power supply voltage VDDCE is greater than the second power supply voltage VDDPE (YES in S520), or alternatively, when the difference between the first power supply voltage VDDCE and the second power supply voltage VDDPE is greater than the reference voltage, a memory operation (e.g., a write operation, a read operation, etc.) is performed on the first bit cells with varying the word-line driving voltage VWL (i.e., by activating the assist function) according to the difference between the first power supply voltage VDDCE and the second power supply voltage VDDPE (S530). The memory device 100 performs the memory operation by decreasing the level of the word-line driving voltage VWL in proportion to (and/or based on) the difference between the first power supply voltage VDDCE and the second power supply voltage VDDPE and may increase and/or ensure a write margin in the write operation and operation stability in the read operation.

The memory operation may correspond to the read operation. Afterwards, the memory device 100 outputs the data.

Figure 19:
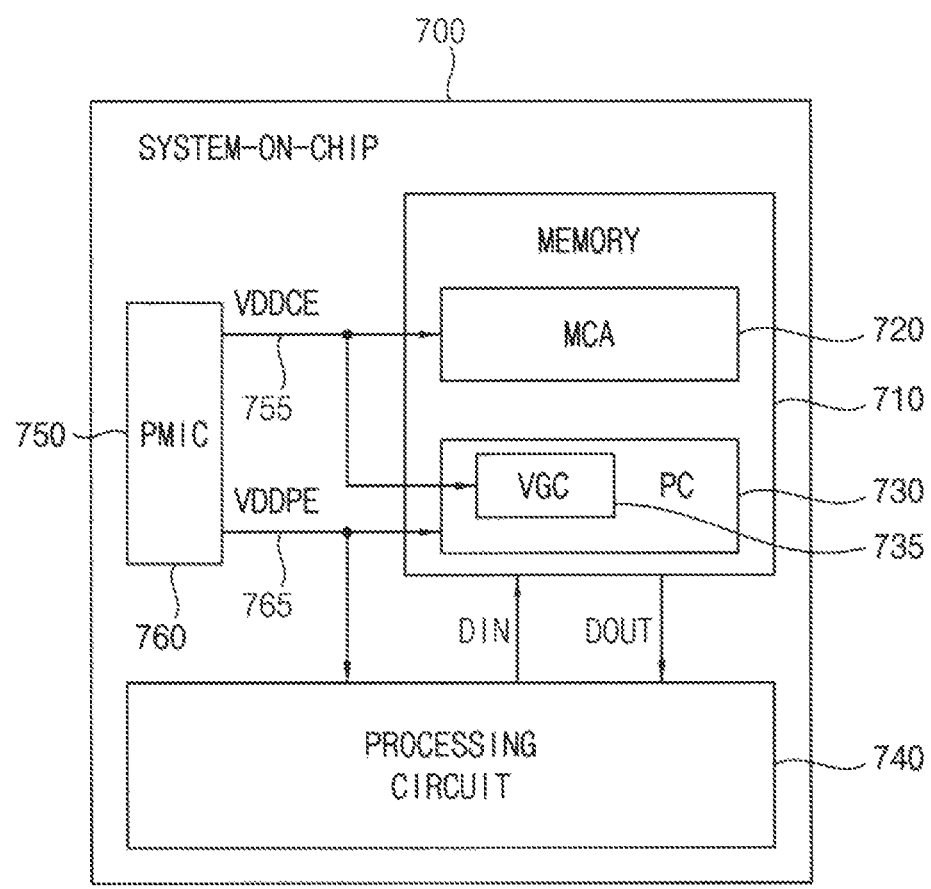
FIG. 19 is a block diagram illustrating a system-on-chip (SoC) including a memory device according to at least one example embodiment.

FIG. 19 is a block diagram illustrating a system-on-chip (SoC) including a memory device according to at least one example embodiment.

Referring to FIG. 19, a system-on-chip 700 may include a memory device 710, a processing circuit 740 and/or a PMIC 760, etc., but is not limited thereto. In at least one example embodiment, the system-on-chip 700 may be an application processor (AP), but is not limited thereto.

The memory device 710 includes a memory cell array 720 that stores data, and a peripheral circuit (PC) 730 that controls the memory cell array 720. In at least one example embodiment, the memory device 710 may be a static random access memory (SRAM) device. The processing circuit 740 may provide data DIN to the memory device 710 to store the data DIN in the memory cell array 720, and may receive data DOUT stored in the memory cell array 720 from the memory device 710.

The PMIC 750 may supply the memory cell array 720 of the memory device 710 with a first power supply voltage VDDCE through a first power supply line 755. The PMIC 750 may supply the processing circuit 740 and the peripheral circuit 730 of the memory device 710 with a second power supply voltage VDDPE through a second power supply line 765.

In at least one example embodiment, the PMIC 750 may include a first voltage regulator and a second voltage regulator, the first voltage regulator generates the first power supply voltage VDDCE and the second voltage regulator generates the second power supply voltage VDDPE.

The peripheral circuit 730 may include a voltage generation circuit (VGC) 735. The voltage generation circuit 735 is supplied with the first power supply voltage VDDCE and the second power supply voltage VDDPE and adaptively adjusts a word-line driving voltage VWL, which is applied to a first word-line coupled to first bit cells selected from the bit cells, directly or indirectly according to a difference between the first power supply voltage VDDCE and the second power supply voltage VDDPE during a memory operation on the first bit cells. Therefore, the memory device 710 may ensure operation stability with maintaining and/or enhancing operation performance.

Figure 20:
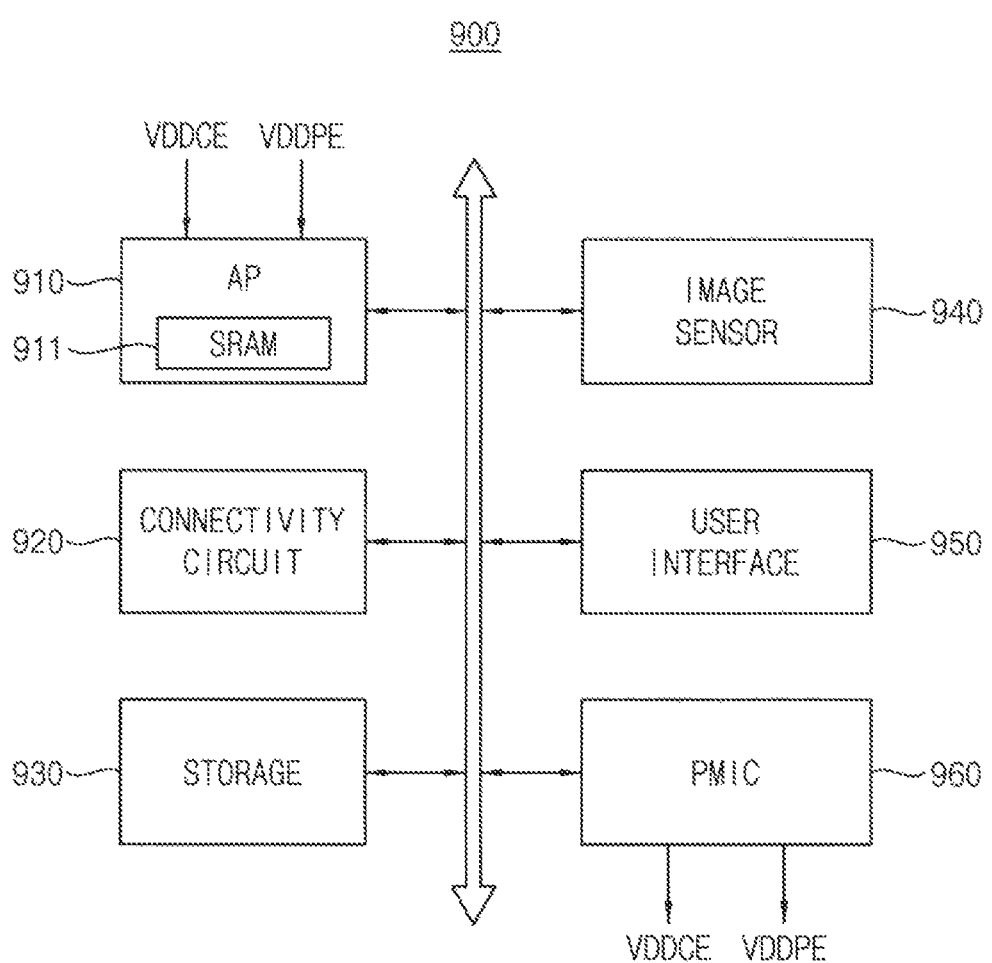
FIG. 20 is a block diagram illustrating a mobile device including a memory device according to at least one example embodiment.

FIG. 20 is a block diagram illustrating a mobile device including a memory device according to at least one example embodiment.

Referring to FIG. 20, a mobile device 900 includes an application processor 910, and/or an image sensor 940, etc., but is not limited thereto. The mobile device 900 may further include a connectivity circuit 920, a storage device 930, a user interface 950, and/or a PMIC 960, but is not limited thereto.

The application processor 910 may be one or more microprocessors and controls overall operations of the mobile device 900. The application processor 910 may include a static memory device 911. The static memory device 911 may employ the memory device 100 of FIG. 3, as an example.

The image sensor 940 is controlled by the application processor 910, and generates image signals by picking-up objects, stores the image signals in the storage device 930, or provides the image signals to the application processor 910.

The connectivity circuit 9200 may perform wired and/or wireless communication with an external device. The storage device 930 may store data associated with operation of the mobile device 900.

The user interface 950 may include at least one input device such as, for example, a keypad, a button, a touch screen, etc., and/or at least one output device such as, for example, a display device, etc.

The PMIC 960 may provide driving voltages associated with operations of the mobile device 900. The PMIC 960 generates a first power supply voltage VDDCE and a second power supply voltage VDDPE, provides the first power supply voltage VDDCE to a memory cell array of the static memory device 911 and provides the second power supply voltage VDDPE to a peripheral circuit of the static memory device 911.

The peripheral circuit may include a voltage generation circuit. The voltage generation circuit may change a level of a word-line driving voltage, which is applied to a word-line coupled to bit cells in the memory cell array, directly or indirectly according to the difference between the first power supply voltage VDDCE and the second power supply voltage VDDPE. Therefore, the static memory device 911 may ensure operation stability.

In at least one example embodiment of the inventive concepts, the mobile device 900 and/or components of the mobile device 900 may be packaged in various forms.

Accordingly, the example embodiments of the inventive concepts may be applied to various memory devices and various application which ensure operation stability with maintaining and/or enhancing operation performance.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A memory device, comprising:
a memory cell array configured to receive a first power supply voltage, the memory cell array including a plurality of bit cells configured to store data based on the first power supply voltage;
a peripheral circuit configured to receive a second power supply voltage, and control the memory cell array based on the second power supply voltage, the peripheral circuit including a voltage generation circuit; and
the voltage generation circuit is configured to,
receive the first power supply voltage and the second power supply voltage,
adaptively adjust a magnitude of a voltage level of a word-line driving voltage directly or indirectly based on a difference between the first power supply voltage and the second power supply voltage during a memory operation on the plurality of bit cells, and
apply the adjusted word-line driving voltage to a first word-line coupled to first bit cells selected from the plurality of bit cells.

2. The memory device of claim 1, wherein the voltage generation circuit further comprises:
a tracking voltage generator configured to receive the first power supply voltage and the second power supply voltage, and generate a tracking voltage reflecting the difference between the first power supply voltage and the second power supply voltage;
an assist pulse generator configured to generate an assist pulse signal based on an assist signal and an internal clock signal; and
at least one word-line power voltage generator connected between the first power supply voltage and a ground voltage,
the at least one word-line power voltage generator configured to generate a word-line power voltage based on the tracking voltage, the assist pulse signal, and a chip selection signal, and apply the generated word-line power voltage to a word-line driver, wherein the word-line driver is configured to apply the word-line driving voltage to the first word-line.

3. The memory device of claim 2, wherein the at least one word-line power voltage generator comprises:
 a first p-channel metal-oxide semiconductor (PMOS) transistor that includes a source coupled to the first power supply voltage, a gate receiving the chip selection signal, and a drain coupled to a first node;
 a second PMOS transistor that includes a source coupled the first node, a gate receiving the tracking voltage, and a drain coupled to a second node; and
 a n-channel metal-oxide semiconductor (NMOS) transistor that includes a drain coupled to the second node, a gate receiving the assist pulse signal, and a source coupled to the ground voltage,
 wherein the at least one word-line power voltage generator is configured to provide the word-line power voltage at the first node.

4. The memory device of claim 3, wherein the at least one word-line power voltage generator is configured to decrease the magnitude of the voltage level of the word-line power voltage based on the difference between the first power supply voltage and the second power supply voltage.

5. The memory device of claim 2, wherein the tracking voltage generator comprises:
 an operational amplifier configured to output a comparison signal based on the first power supply voltage and the second power supply voltage;
 a switch controller configured to generate a switching control signal based on the comparison signal;
 a voltage divider that includes a plurality of resistors connected in series between the second power supply voltage and the ground voltage; and
 a switch circuit that includes a plurality of switches, each of the plurality of switches being connected in parallel between two ends of at least one of the plurality of resistors and an output node,
 wherein the plurality of switches are selectively turned-on based on bits of the switching control signal to provide the tracking voltage at the output node.

6. The memory device of claim 2, wherein the at least one word-line power voltage generator comprises:
 a first word-line power voltage generator connected to a first end of an internal power voltage line connected to the word-line driver, the first word-line power voltage generator configured to provide a first word-line power voltage to the word-line driver; and
 a second word-line power voltage generator connected to a second end of the internal power voltage line, the second word-line power voltage generator configured to provide a second word-line power voltage to the word-line driver.

7. The memory device of claim 1, wherein the voltage generation circuit comprises:
 a tracking voltage generator configured to receive the first power supply voltage and the second power supply voltage, and generate a tracking voltage reflecting the difference between the first power supply voltage and the second power supply voltage;
 at least one word-line power voltage generator connected between the first power supply voltage and a ground voltage, the at least one word-line power voltage generator configured to generate a word-line power voltage based on a chip selection signal, and apply the generated word-line power voltage to a word-line driver;

the word-line driver is configured to apply the word-line driving voltage to the first word-line; and
 a selection circuit configured to select one of the tracking voltage and the first power supply voltage as an assist pulse signal based on an assist signal, and apply the assist pulse signal to a gate of a first voltage adjusting transistor,
 wherein the first voltage adjusting transistor is connected between the first word-line and the ground voltage.

8. The memory device of claim 7, wherein
 the at least one word-line power voltage generator includes a first p-channel metal-oxide semiconductor (PMOS) transistor that includes a source coupled to the first power supply voltage, a gate receiving the chip selection signal, and a drain coupled to an internal power voltage line connected to the word-line driver, and
 the first voltage adjusting transistor includes a second PMOS transistor that includes a source coupled to the first word-line, a gate receiving the assist pulse signal, and a drain coupled to the ground voltage.

9. The memory device of claim 7, wherein the selection circuit is configured to:
 select the first power supply voltage as the assist pulse signal when the first power supply voltage is smaller than or equal to the second power supply voltage; and
 select the tracking voltage as the assist pulse signal when the first power supply voltage is greater than the second power supply voltage.

10. The memory device of claim 9, wherein the first voltage adjusting transistor is configured to decrease the magnitude of the voltage level of the word-line driving voltage based on the difference between the first power supply voltage and the second power supply voltage, when the first power supply voltage is greater than the second power supply voltage, based on the assist pulse signal.

11. The memory device of claim 7, wherein the at least one word-line power voltage generator comprises:
 a first word-line power voltage generator connected to a first end of an internal power voltage line connected to the word-line driver, the first word-line power voltage generator configured to provide a first word-line power voltage to the word-line driver; and
 a second word-line power voltage generator connected to a second end of the internal power voltage line, the second word-line power voltage generator configured to provide a second word-line power voltage to the word-line driver.

12. The memory device of claim 1, wherein the peripheral circuit further comprises:
 a row decoder connected to the memory cell array through a plurality of word-lines, the row decoder configured to select one of the plurality of word-lines as the first word-line based on a row address signal;
 a write/read circuit connected to the memory cell array through a plurality of bit-lines and a plurality of complementary bit-lines, the write/read circuit configured to perform a write operation or a read operation on the memory cell array based on a column address, a write enable signal, or a read enable signal; and
 a control circuit configured to control the voltage generation circuit, the row decoder and the write/read circuit based on a command, an address, and a clock signal received from an external source.

13. The memory device of claim 12, wherein the row decoder comprises a word-line driver configured to provide the first word-line with a word-line power voltage provided from the voltage generation circuit.

14. The memory device of claim 12, wherein the row decoder comprises:
   a word-line driver configured to provide the first word-line with a word-line power voltage provided from the voltage generation circuit; and
   a first voltage adjusting transistor connected to the first word-line, the first voltage adjusting transistor configured to receive an assist pulse signal provided from the voltage generation circuit.

15. The memory device of claim 14, wherein the first voltage adjusting transistor comprises:
   a p-channel metal-oxide semiconductor (PMOS) transistor that includes a source coupled to the first word-line;
   a gate receiving an assist pulse signal; and
   a drain coupled to a ground voltage.

16. The memory device of claim 12, wherein each of the plurality of bit cells comprises:
   a first access transistor coupled to a corresponding word-line of the plurality of word-lines and a corresponding bit-line of the plurality of bit-lines;
   a second access transistor coupled to the corresponding word-line and a corresponding complementary bit-line of the plurality of complementary bit-lines; and
   a data storage circuit connected to the first access transistor and the second access transistor, the data storage circuit configured to receive the first power supply voltage, and store corresponding data.

17. A system-on-chip device comprises:
   a memory device configured to store data, the memory device including a memory cell array including a plurality of bit cells;
   a peripheral circuit configured to control the memory cell array;
   a processing circuit configured to provide the data to the memory device before the data is stored in the memory cell array, and receive the data stored in the memory cell array from the memory device;
   a power management integrated circuit (PMIC) configured to provide a first power supply voltage to the memory cell array, and provide a second power supply voltage to the peripheral circuit, the peripheral circuit including a voltage generation circuit; and
   the voltage generation circuit configured to,
      receive the first power supply voltage and the second power supply voltage,
      adaptively adjust a magnitude of a voltage level of a word-line driving voltage directly or indirectly based on a difference between the first power supply voltage and the second power supply voltage during a memory operation on the plurality of bit cells, and apply the adjusted word-line driving voltage to a first word-line coupled to first bit cells selected from the plurality of bit cells.

18. The system-on-chip device of claim 17, wherein the voltage generation circuit comprises:
   a tracking voltage generator configured to receive the first power supply voltage and the second power supply voltage, and generate a tracking voltage reflecting the difference between the first power supply voltage and the second power supply voltage;
   an assist pulse generator configured to generate an assist pulse signal based on an assist clock signal and an internal clock signal; and
   at least one word-line power voltage generator connected between the first power supply voltage and a ground voltage, the at least one word-line power voltage generator configured to generate a word-line power voltage based on the tracking voltage, the assist pulse signal, and a chip selection signal, and apply the generated word-line power voltage to a word-line driver,
   wherein the word-line driver is configured to apply the word-line driving voltage to the first word-line.

19. The system-on-chip device of claim 17, wherein the voltage generation circuit comprises:
   a tracking voltage generator configured to receive the first power supply voltage and the second power supply voltage, and generate a tracking voltage reflecting the difference between the first power supply voltage and the second power supply voltage;
   at least one word-line power voltage generator connected between the first power supply voltage and a ground voltage, the at least one word-line power voltage generator configured to generate a word-line power voltage based on a chip selection signal, and apply the generated word-line power voltage to a word-line driver;
   the word-line driver is configured to apply the word-line driving voltage to the first word-line; and
   a selection circuit configured to select one of the tracking voltage and the first power supply voltage as an assist pulse signal, based on an assist signal, and apply the assist pulse signal to a gate of a first voltage adjusting transistor,
   wherein the first voltage adjusting transistor is connected between the first word-line and the ground voltage.

20. A method of operating a memory device, the memory device including a memory cell array including a plurality of bit cells to store data and a peripheral circuit configured to control the memory cell array, the method comprising:
   generating a result based on a first power supply voltage and a second power supply voltage, the first power supply voltage being supplied to the memory cell array and the second power supply voltage being supplied to the peripheral circuit;
   maintaining a voltage level of a word-line driving voltage applied to a first word-line coupled to first bit cells selected from the plurality of bit cells during a memory operation on the plurality of bit cells, when the result indicates that the first power supply voltage is smaller than or equal to the second power supply voltage; and
   decreasing the voltage level of the word-line driving voltage applied to the first word-line coupled to the first bit cells based on a difference between the first power supply voltage and the second power supply voltage during the memory operation on the plurality of bit cells, when the result indicates that the first power supply voltage is greater than the second power supply voltage.

* * * * *